(12) United States Patent
Ishigami

(10) Patent No.: US 6,198,507 B1
(45) Date of Patent: Mar. 6, 2001

(54) SOLID-STATE IMAGING DEVICE, METHOD OF DRIVING SOLID-STATE IMAGING DEVICE, CAMERA DEVICE, AND CAMERA SYSTEM

(75) Inventor: Tomio Ishigami, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/916,038

(22) Filed: Aug. 21, 1997

Related U.S. Application Data

(63) Continuation of application No. PCT/JP96/03609, filed on Dec. 11, 1996.

(30) Foreign Application Priority Data

Dec. 21, 1995 (JP) .................................................. 7-333644

(51) Int. Cl.$^7$ .................................................. H04N 3/14
(52) U.S. Cl. .................................................. 348/273
(58) Field of Search .................................... 348/312, 315, 348/316, 319, 320, 321, 322, 323, 273

(56) References Cited

U.S. PATENT DOCUMENTS

| | | | |
|---|---|---|---|
| 4,054,915 | * 10/1977 | Sugihara | 348/322 |
| 4,740,828 | * 4/1988 | Kinoshita | 348/322 |
| 4,805,026 | * 2/1989 | Oda | 348/320 |
| 4,851,917 | 7/1989 | Ohzu . | |
| 4,903,121 | 2/1990 | Uomori et al. . | |
| 5,410,349 | 4/1995 | Tanigawa et al. . | |
| 5,528,292 | * 6/1996 | Ikeda | 348/273 |
| 5,956,086 | * 9/1999 | Sawanobori | 348/273 |

FOREIGN PATENT DOCUMENTS

| | | |
|---|---|---|
| 3644266 A1 | 12/1985 | (DE) . |
| 3644266 C2 | 12/1985 | (DE) . |
| 0 291354 A2 | 11/1988 | (EP) . |
| 0 291354 B1 | 11/1988 | (EP) . |
| 62-151078 | 7/1987 | (JP) . |
| 63-283294 | 11/1988 | (JP) . |
| 63-290480 | 11/1988 | (JP) . |
| 64-74885 | 3/1989 | (JP) . |
| 3-18878 | 8/1991 | (JP) . |
| 4-6880 | 3/1992 | (JP) . |
| 7-123421 | 5/1995 | (JP) . |
| 92 01009 | 2/1992 | (KR) . |

* cited by examiner

Primary Examiner—Wendy Garber
Assistant Examiner—Alicia M. Harrington
(74) Attorney, Agent, or Firm—Sonnenschein, Nath & Rosenthal

(57) ABSTRACT

An all-pixel reading image sensor or a noninterlaced output image sensor, in which an interlaced signal can selectively be output without the use of a frame memory or the like as an external circuit. For outputting an interlaced signal from a three-layer three-phase drive all-pixel reading CCD image sensor, vertical shift registers are supplied with first through third vertical transfer pulses to transfer signal charges in the pixels of an nth line, for example, to a horizontal shift register, and then the horizontal shift register is supplied with horizontal transfer pulses to transfer (shift) the signal charges of the nth line stored in the horizontal shift register by two pixels, for example, to an output unit. Thereafter, the vertical shift registers are supplied with first through third vertical transfer pulses to transfer signal charges in the pixels of an (n+1)th line to the horizontal shift register, in which the signal charges of the nth line and the signal charges of the (n+1)th line are mixed with each other.

22 Claims, 14 Drawing Sheets

FIG. 7

| R | G | B | G |
|---|---|---|---|
| B | G | R | G |

SOLID-STATE IMAGING DEVICE, METHOD OF DRIVING SOLID-STATE IMAGING DEVICE, CAMERA DEVICE, AND CAMERA SYSTEM

RELATED APPLICATION DATA

This is a continuation of International Application No. PCT/JP96/03609 filed Dec. 11, 1996, claiming priority to Japanese application No. P07-333644 filed Dec. 21, 1995. This Japanese application is incorporated herein by reference to the extent not already presented herein.

BACKGROUND OF THE INVENTION

The present invention relates to a solid-state imaging device which includes a charge transfer unit comprising a CCD, for example, for producing an image output signal based on all-pixel reading principles or noninterlaced principles, the solid-state imaging device being capable of selectively producing an output image signal based on noninterlaced principles, a method of driving the solid-state imaging device for such a charge transfer process, a camera device incorporating the solid-state imaging device, and a camera system for storing an image signal based on the noninterlaced principles (hereinafter referred to as a "noninterlaced signal") from the camera device into an external memory and displaying a noninterlaced signal from the camera device on a monitor screen.

Generally, camera devices for imaging and displaying subjects on monitor devices have solid-state imaging devices for producing an output image signal based on interlaced principles because the monitor devices usually employ interlaced principles such as NTSC or the like.

The solid-state imaging devices for producing an interlaced output image signal generally include a CCD image sensor of the vertical four-phase drive, IT (interline transfer) type and a CCD image sensor of the vertical four-phase drive, FIT (frame interline transfer) type.

As shown in FIG. 1 of the accompanying drawings, an CCD image sensor of the interline transfer type has an imaging unit 103 comprising a matrix of photodetectors 101 for photoelectrically converting incident light into electric charges depending on the amount of the incident light and a number of vertical shift registers 102 shared by columns of photodetectors 101 and arranged along rows of photodetectors 101.

The image sensor also has a horizontal shift register 104 shared by the vertical shift registers 102. The horizontal shift register 104 has a final stage connected to an output unit 105 which has a charge-to-voltage converter comprising a floating-diffusion device or a floating-gate device and an output amplifier for amplifying an output signal from the charge-to-voltage converter.

When vertical transfer pulses φV1–φV4 in four phases are supplied to the imaging unit 103, a distribution of potentials under respective vertical transfer electrodes of the imaging unit 103 varies successively to transfer signal charges along the vertical shift registers 102 in a vertical direction (to the horizontal shift register 104).

When horizontal transfer pulses φH1, φH2 in two different phases are then applied to horizontal transfer electrodes in the form of two polycrystalline silicon layers, for example, on the horizontal shift register 104, the signal charges are successively transferred to the output unit 105. The output unit 105 converts the transferred signal charges into an electric signal, which is then outputted as an image signal S from an output terminal fout.

In an odd-numbered field, first and second lines and third and fourth lines are mixed with each other in the vertical shift registers 102, and transferred to the horizontal shift register 104. In an even-numbered field, second and third lines and fourth and fifth lines are mixed with each other in the vertical shift registers 102, and transferred to the horizontal shift register 104.

Recently, there has been a growing demand for an all-pixel reading CCD image sensor for independently reading information of all pixels and a CCD image sensor for noninterlacing pixel signals on the frame transfer principles, for use in applications such as the inputting of images to computers and electronic still cameras.

One proposed image sensor for reading all pixels has a vertical transfer unit comprising a 3-layer, 3-phase CCD as shown in FIG. 2 of the accompanying drawings. Those parts shown in FIG. 2 which are identical to those shown in FIG. 1 are denoted by identical reference numerals, and will not be described below.

A process of vertically transferring signal charges along the vertical shift registers 102 in the 3-layer, 3-phase CCD image sensor will be described below with reference to a timing chart shown in FIG. 3 of the accompanying drawings and an operation diagram shown in FIG. 4 of the accompanying drawings.

After the end of a cycle of reading signal charges in a vertical blanking period, a signal charge "e" is transferred to and stored in a potential well formed beneath a second vertical transfer electrode 111b at a time t1. At a next time t2, since a first vertical transfer pulse φV1 is of a high level, a potential well is formed beneath a first vertical transfer electrode 111a. The signal charge "e" after it is read is transferred to and stored in the potential wells that are consecutively formed beneath the first and second vertical transfer electrodes 111a, 111b.

At a next time t3, since a second vertical transfer pulse φV2 is of a low level, a potential barrier is formed beneath the second vertical transfer electrode 111b. The signal charge "e" is transferred to and stored in the potential well that is formed beneath the first vertical transfer electrode 111a.

At a next time t4, since a third vertical transfer pulse φV3 is of a high level, a potential well is formed beneath a third vertical transfer electrode 111c. The signal charge "e" is transferred to and stored in the potential wells that are consecutively formed beneath the first and third vertical transfer electrodes 111a, 111c.

At a next time t5, since the first vertical transfer pulse φV1 is of a low level, a potential barrier is formed beneath the first vertical transfer electrode 111a. The signal charge "e" is transferred to and stored in the potential well that is formed beneath the third vertical transfer electrode 111c.

At a next time t6, since the second vertical transfer pulse φV2 is of a high level, a potential well is formed beneath the second vertical transfer electrode 111b. The signal charge "e" is transferred to and stored in the potential wells that are consecutively formed beneath the second and third vertical transfer electrodes 111b, 111c.

At a next time t7, since the third vertical transfer pulse φV3 is of a low level, a potential barrier is formed beneath the third vertical transfer electrode 111c. The signal charge "e" is transferred to and stored in the potential well that is formed beneath the second vertical transfer electrode 111b.

At this time, the signal charge "e" that has been stored in the second vertical transfer electrode 111b in the previous stage is transferred to the second vertical transfer electrode 111b in the next stage. In this manner, the first through third vertical transfer pulses φV1~φV3 are applied respectively to the vertical transfer electrodes 11a~111c, independently transferring the signal charges "e" of all the pixels successively in the vertical direction.

In the above electronic still camera, imaged information is displayed on a monitor device to determine an image angle.

Since a solid-state imaging device for use in an electronic still camera comprises an all-pixel reading CCD image sensor independently reading information of all pixels or a CCD image sensor for noninterlacing pixel signals based on the frame transfer principles, as described above, a monitor device for use with such a solid-state imaging device should preferably be of a noninterlaced type.

However, the noninterlaced monitor device is so expensive that it forms a bottleneck in presenting electronic still cameras for widespread usage.

For displaying noninterlaced imaged information on an inexpensive interlaced monitor device such as an NTSC monitor device, it is necessary to convert the noninterlaced signal to an interlaced signal.

To obtain an interlaced signal directly from a solid-state imaging device, it has been customary to mix signal charges from vertically adjacent two pixels in a vertical shift register. This process is made possible because the arrangement of color filters on the imaging unit is in accord with the noninterlaced principles.

One example of the arrangement of color filters on the imaging unit which is in accord with the noninterlaced principles is that a repetitive pattern of the colors of color filters in one row is the same for all rows of color filters.

Some electronic still cameras, however, may employ color filters whose colors are arranged in a pattern which is not in accord with the noninterlaced principles based on the mixture of signal charges from vertically adjacent two pixels. For example, a G-stripe R/B grid coding pattern or an R/B grid coding pattern may be used as such a color filter pattern.

If signal charges from vertically adjacent two pixels are mixed using color filters arranged in a G-stripe R/B grid coding pattern, then since the electronic still camera outputs only a 2G signal represented by mixed green signal charges and RB signals represented by mixed red and blue signal charges, it is not possible to generate color signals in a subsequent signal processing stage.

In a conventional system which employs a solid-state imaging device of a color coding pattern which is not in accord with the noninterlaced principles based on the mixture of signal charges from vertically adjacent two pixels, an imaging signal of one frame is stored in a memory (frame memory), and thereafter an interlaced signal is outputted.

However, the above conventional system is problematic in that since a large-capacity image memory such as a frame memory is required as an external circuit, the manufacturing cost thereof and the amount of electric energy consumed thereby are large.

SUMMARY

The present invention has been made in view of the above problems. It is an object of the present invention to provide a solid-state imaging device which is capable of selectively outputting an interlaced signal without the use of a frame memory or the like as an external circuit, in an all-pixel reading image sensor or a noninterlaced output image sensor.

Another object of the present invention is to provide a method of driving a solidstate imaging device which is capable of selectively outputting an interlaced signal without the use of a frame memory or the like as an external circuit, in an all-pixel reading image sensor or a noninterlaced output image sensor.

Still another object of the present invention is to provide a camera device which is capable of selectively outputting an interlaced signal without the use of a frame memory or the like as an external circuit, the camera device incorporating an all-pixel reading image sensor or a noninterlaced output image sensor.

Yet still another object of the present invention is to provide a camera system which is capable of storing a noninterlaced signal outputted from a camera device which incorporates an all-pixel reading image sensor or a noninterlaced output image sensor, into an external memory device for a computer, and displaying an interlaced signal selectively outputted from the camera device on the screen of a monitor device based on the NTSC principles.

In an embodiment, the invention provides solid-state imaging device having an imaging unit comprising a matrix of photodetectors as pixels for photoelectrically converting incident light from a subject into signal charges depending on the amount of the incident light, and color filters arranged on the imaging unit in a predetermined pattern corresponding to the pixels. In the solid-state imaging device and according to a method of driving the solid-state imaging device, signal charges stored in the respective pixels are transferred in each line to a horizontal shift register based on a group of first transfer pulses supplied in a horizontal blanking period, and signal charges stored in the respective pixels are transferred in each two lines to the horizontal shift register based on a group of second transfer pulses supplied in the horizontal blanking period.

In a charge storage period, the photodetectors as the pixels photoelectrically convert incident light from a subject into signal charges depending on the amount of the incident light. Thereafter, in a horizontal blanking period, the signal charges stored in the photodetectors are successively transferred to the horizontal shift register.

When the group of first transfer pulses is supplied in the horizontal blanking period, the signal charges stored in the pixels are successively transferred in each line to the horizontal shift register. The solid state imaging device now outputs a noninterlaced imaging signal.

When the group of second transfer pulses is supplied in the horizontal blanking period, the signal charges stored in the pixels are successively transferred in each two lines to the horizontal shift register. The sold-state imaging device now outputs an interlaced imaging signal. Specifically, because the signal charges of the second line are transferred to the horizontal shift register after the signal charges of the first line are transferred to the horizontal shift register, the signal charges of the first line and the signal charges of the second line are mixed with each other in the horizontal shift register, and, as a result, are outputted as an interlaced imaging signal.

If one said group of first transfer pulses is supplied in an arbitrary horizontal blanking period in every other vertical blanking period when the group of second transfer pulses is supplied in the horizontal blanking period, then signal charges of first and second lines, for example, are mixed in the horizontal shift register in the period of an odd-numbered field. In a next even-numbered field, since one group of first transfer pulses is supplied to output signal charges of one line in a vertical blanking period prior to the period of the next even-numbered field, signal charges of second and third lines, for example, are mixed in the horizontal shift register.

As a consequence, the solidstate imaging device outputs an interlaced imaging signal having an odd-numbered field and an even-numbered field.

Specifically, the solid-state imaging device will be described below in which the predetermined pattern is such that when color filters of an nth line (n=1, 2, . . . ) are spatially shifted a predetermined number of pixels, the repetitive pattern of colors of the nth line is the same as the repetitive pattern of colors of an (n+1)th line, the group of second transfer pulses comprises the group of first transfer pulses which is supplied in two cycles, and horizontal transfer pulses are supplied to the horizontal shift register for transferring the signal charges transferred to the horizontal shift register by the predetermined number of pixels after the group of first transfer pulses is supplied in the first cycle.

First, when the group of first transfer pulses in the group of second transfer pulses is supplied in the first cycle, the signal charges of the pixels are supplied in each line to the horizontal shift register, so that signal charges of an nth line, for example, are transferred to and stored in the horizontal shift register. Thereafter, the horizontal transfer pulses are supplied to the horizontal shift register to shift the signal charges in the horizontal shift register by pixels corresponding to a horizontal shift of the color filters. Consequently, the repetitive pattern of colors of signal charges in a range corresponding to the imaging unit and the repetitive pattern of colors of signal charges of an (n+1)th line stored in a final stage, for example, of the imaging unit, out of the signal charges of the nth line stored in the horizontal shift register, become the same as each other.

Subsequently, when the group of first transfer pulses in the group of second transfer pulses is supplied in the second cycle, the signal charges of the pixels are supplied in each line to the horizontal shift register, so that signal charges of an (n+1)th line, for example, are transferred to and stored in the horizontal shift register. As a result, the signal charges of the nth line and the signal charges of the (n+1)th line are mixed with each other in the horizontal shift register.

As described above, since the repetitive pattern of colors of the signal charges of the nth line and the repetitive pattern of colors of the signal charges of the (n+1)th line are the same as each other, the same colors are mixed with each other. Therefore, two pixels in the vertical direction for producing an interlaced signal are mixed in the horizontal shift register.

With the solid-state imaging device and the method of driving same according to the present invention, therefore, when the group of first transfer pulses is supplied in a horizontal blanking period, an all-pixel reading image sensor or a noninterlaced signal output image sensor outputs a noninterlaced signal. When the group of second transfer pulses is supplied in a horizontal blanking period, the all-pixel reading image sensor or the noninterlaced signal output image sensor outputs an interlaced signal. The image sensor is capable of selectively outputting an interlaced signal without the use of a frame memory or the like as an external circuit.

A camera device according to the present invention has a solid-state imaging device having an imaging unit comprising a matrix of photodetectors as pixels for photoelectrically converting incident light from a subject into signal charges depending on the amount of the incident light, and color filters arranged on the imaging unit in a predetermined pattern corresponding to the pixels, a first timing generating circuit for generating a group of first transfer pulses for transferring signals charges stored in the respective pixels in a horizontal blanking period in each line to a horizontal shift register, based on a reference clock signal, a second timing generating circuit for generating a group of second transfer pulses for transferring signals charges stored in the respective pixels in the horizontal blanking period in each two lines to the horizontal shift register, based on the reference clock signal, and selecting means for selecting the group of first transfer pulses as a group of transfer pulses to be supplied to the solid-state imaging device based on an external command for a noninterlaced signal, and selecting the group of second transfer pulses as a group of transfer pulses to be supplied to the solid-state imaging device based on an external command for an interlaced signal.

In a charge storage period, the photodetectors as the pixels photoelectrically convert incident light from a subject into signal charges depending on the amount of the incident light. Thereafter, in a horizontal blanking period, the signal charges stored in the photodetectors are successively transferred to the horizontal shift register.

If a command for outputting a noninterlaced signal is supplied from an external source, the selecting means selects the group of first transfer pulses from the first timing generating circuit, and supplies the group of first transfer pulses to the solid-state imaging device.

In the solid-state imaging device, the signal charges stored in the pixels are successively transferred in each line to the horizontal shift register based on the first transfer pulses supplied from the first timing generating circuit through the selecting means, and the solidstate imaging device outputs a noninterlaced imaging signal.

If a command for outputting an interlaced signal is supplied from the external source, the selecting means selects the group of second transfer pulses from the second timing generating circuit, and supplies the group of second transfer pulses to the solid-state imaging device.

In the solid-state imaging device, the signal charges stored in the pixels are successively transferred in each two lines to the horizontal shift register based on the second transfer pulses supplied from the second timing generating circuit through the selecting means, and the solidstate imaging device outputs an interlaced imaging signal. Specifically, since the signal charges of the second line are transferred to the horizontal shift register after the signal charges of the first line are transferred to the horizontal shift register, the signal charges of the first line and the signal charges of the second line are mixed in the horizontal shift register. As a result, the solidstate imaging device outputs an interlaced imaging signal.

If one said group of transfer pulses is outputted from the second timing generating circuit in an arbitrary horizontal blanking period in every other vertical blanking period in case a command for outputting an interlaced signal is supplied from the external source, the camera device operates as follows:

Specifically, in the period of an odd-numbered field, signal charges from the first and second lines, for example, are mixed with each other in horizontal shift register. In the period of a next even-numbered field, since one group of first transfer pulses has been outputted in a vertical blanking period prior to the period of the even-numbered field to output signal charges of one line, signal charges from the second and third lines, for example, are mixed with each other in horizontal shift register.

As a consequence, the solid-state imaging device outputs an interlaced imaging signal having odd- and even-numbered fields.

Specifically, if the predetermined pattern is such that when color filters of an nth line (n=1, 2, . . . ) are spatially shifted a predetermined number of pixels, the repetitive pattern of colors of the nth line is the same as the repetitive pattern of colors of an (n+1)th line, the group of second transfer pulses outputted from the second timing generating circuit comprises the group of first transfer pulses which is supplied in two cycles, and horizontal transfer pulses are supplied to the horizontal shift register for transferring the signal charges transferred to the horizontal shift register by the predetermined number of pixels after the group of first transfer pulses is supplied in the first cycle from the second timing generating circuit, then the camera device will operate as follows.

First, when the group of first transfer pulses in the group of second transfer pulses is supplied in the first cycle, the signal charges of the pixels are supplied in each line to the horizontal shift register, so that signal charges of an nth line, for example, are transferred to and stored in the horizontal shift register. Thereafter, the horizontal transfer pulses are supplied to the horizontal shift register to shift the signal charges in the horizontal shift register by pixels corresponding to a horizontal shift of the color filters. Consequently, the repetitive pattern of colors of signal charges in a range corresponding to the imaging unit and the repetitive pattern of colors of signal charges of an (n+1)th line stored in a final stage, for example, of the imaging unit, out of the signal charges of the nth line stored in the horizontal shift register, become the same as each other.

Subsequently, when the group of first transfer pulses in the group of second transfer pulses is supplied in the second cycle, the signal charges of the pixels are supplied in each line to the horizontal shift register, so that signal charges of an (n+1)th line, for example, are transferred to and stored in the horizontal shift register. As a result, the signal charges of the nth line and the signal charges of the (n+1)th line are mixed with each other in the horizontal shift register.

As described above, since the repetitive pattern of colors of the signal charges of the nth line and the repetitive pattern of colors of the signal charges of the (n+1)th line are the same as each other, the same colors are mixed with each other. Therefore, two pixels in the vertical direction for producing an interlaced signal are mixed in the horizontal shift register.

In the camera device according to the present invention, as described above, based on a command for outputting a noninterlaced signal which is supplied from the external source, the group of first transfer pulses is supplied from the first timing generating circuit to the solid-state imaging device in a horizontal blanking period, causing the solid-state imaging device to output a noninterlaced signal. Based on a command for outputting an interlaced signal which is supplied from the external source, the group of second transfer pulses is supplied from the second timing generating circuit to the solid-state imaging device in a horizontal blanking period, causing the solid-state imaging device to output an interlaced signal. Therefore, the camera device which incorporates an all-pixel reading image sensor or an image sensor for outputting a noninterlaced signal is capable of selectively outputting an interlaced signal without the use of a frame memory or the like as an external circuit.

A camera system according to the present invention comprises a camera device of the structure described below, an external memory device, a display device, and a switching means.

The camera device comprises a solid-state imaging device having an imaging unit comprising a matrix of photodetectors as pixels for photoelectrically converting incident light from a subject into signal charges depending on the amount of the incident light, and color filters arranged on the imaging unit in a predetermined pattern corresponding to the pixels, a first timing generating circuit for generating a group of first transfer pulses for transferring signals charges stored in the respective pixels in a horizontal blanking period in each line to a horizontal shift register, based on a reference clock signal, a second timing generating circuit for generating a group of second transfer pulses for transferring signals charges stored in the respective pixels in the horizontal blanking period in each two lines to the horizontal shift register, based on the reference clock signal, and selecting means for selecting the group of second transfer pulses as a group of transfer pulses to be supplied to the solid-state imaging device in normal operation, and selecting the group of first transfer pulses as a group of transfer pulses to be supplied to the solid-state imaging device based on an interrupt signal from an external shutter control key.

The external memory device has a memory for storing an imaging signal of at least one frame which is outputted from the solid-state imaging device, and the display device is arranged to convert the imaging signal outputted from the solid-state imaging device into a video signal and displaying the video signal on a screen.

The switching means is arranged to supply the imaging signal outputted from the solid-state imaging device to the display device in the normal operation, and switching to supply the imaging signal outputted from the solid-state imaging device to the external memory device based on the interrupt signal from the external shutter control key.

In the solid-state imaging device of the camera device of the camera system, in a charge storage period, the photodetectors as the pixels photoelectrically convert incident light from a subject into signal charges depending on the amount of the incident light. Thereafter, in a horizontal blanking period, the signal charges stored in the photodetectors are successively transferred to the horizontal shift register.

In normal operation, i.e., in an interlaced signal output process, the group of second transfer pulses from the second timing generating circuit is selected by the selecting means, and supplied to the solid-state imaging device.

In the solid-state imaging device, based on the group of second transfer pulses supplied from the second timing generating circuit through the selecting means, the signal charges stored in the pixels are successively transferred in each line to the horizontal shift register, and the solidstate imaging device outputs a noninterlaced imaging signal.

Specifically, since the signal charges of the second line are transferred to the horizontal shift register after the signal charges of the first line are transferred to the horizontal shift register, the signal charges of the first line and the signal charges of the second line are mixed in the horizontal shift register. As a result, the solidstate imaging device outputs an interlaced imaging signal.

In the normal operation, if one said group of transfer pulses is outputted from the second timing generating circuit in an arbitrary horizontal blanking period in every other vertical blanking period, the camera system operates as follows:

Specifically, in the period of an odd-numbered field, signal charges from the first and second lines, for example, are mixed with each other in horizontal shift register. In the period of a next even-numbered field, since one group of first transfer pulses has been outputted in a vertical blanking period prior to the period of the even-numbered field to output signal charges of one line, signal charges from the second and third lines, for example, are mixed with each other in horizontal shift register.

As a consequence, the solid-state imaging device outputs an interlaced imaging signal having odd- and even-numbered fields.

Since the camera system is in the normal operation, the switching means supplies the output signal from the solid-state imaging device at all times to the display device. Therefore, the display device is supplied with the interlaced imaging signal outputted from the solid-state imaging device, and displays a noninterlaced image on the screen thereof.

When an interrupt signal is applied based on the operation of a shutter control key during the normal operation of the camera system, the selecting means selects the group of first transfer pulses from the first timing generating circuit, and supplies the group of first transfer pulses to the solidstate imaging device of the camera device.

Consequently, based on the group of first transfer pulses supplied from the first timing generating circuit through the selecting means, the signal charges stored in the respective pixels are successively transferred in each line to the horizontal shift register, so that the solidstate imaging device outputs a noninterlaced imaging signal.

When the above interrupt signal is applied, the switching means switches the output signal from the solidstate imaging device to the external memory device. Therefore, the non-interlaced imaging signal (e.g., an image signal of one frame) outputted from the solid-state imaging device is supplied through the switching means to the externa memory device, and stored in a memory area of the external memory device. The imaging signal stored in the external memory device may be printed on a print sheet by a processing operation of a computer or outputted to a monitor device which is compatible with noninterlaced imaging signals.

In the camera system according to the present invention, in the normal operation (interlaced signal output operation), the group of second transfer pulses is supplied from the second timing generating circuit to the solid-state imaging device in a horizontal blanking period, causing the solid-state imaging device to output an interlaced signal. The interlaced signal is supplied through the switching means to a monitor device which is compatible with noninterlaced imaging signals. Based on an interrupt signal applied based on the operation of the shutter control key, the group of first transfer pulses is supplied from the first timing generating circuit to the solid-state imaging device in a horizontal blanking period, causing the solid-state imaging device to output a noninterlaced signal. The noninterlaced signal is supplied through the switching means to the external memory device.

The camera system according to the present invention is thus capable of storing a noninterlaced signal, outputted from the camera device which incorporates an all-pixel reading image sensor or a noninterlaced signal output image sensor, into an external memory device for a computer, and can display an interlaced signal selectively outputted from the camera device on the screen of an NTSC monitor device.

BRIEF DESCRIPTION OF DRAWINGS

FIG. 7 is a diagram illustrative of the colors of color filters arranged in a G-stripe R/B grid coding pattern which are used in the image sensor according to the embodiment;

DETAILED DESCRIPTION OF THE PRESENTLY PREFERRED EMBODIMENT

A three-layer, three-phase, all-pixel reading CCD image sensor to which a solid-state imaging device according to the present invention (hereinafter referred to as a CCD sensor according to an embodiment of the present invention, a camera device which incorporates the image sensor according to the embodiment (hereinafter referred to as a camera device according to an embodiment of the present invention), and a camera system which incorporates the camera device according to the embodiment (hereinafter referred to as a camera system according to an embodiment of the present invention) will be described below with reference to FIGS. 5 through 18.

An image sensor according to an embodiment of the present invention will first be described below with reference to FIG. 5.

Figure 1:
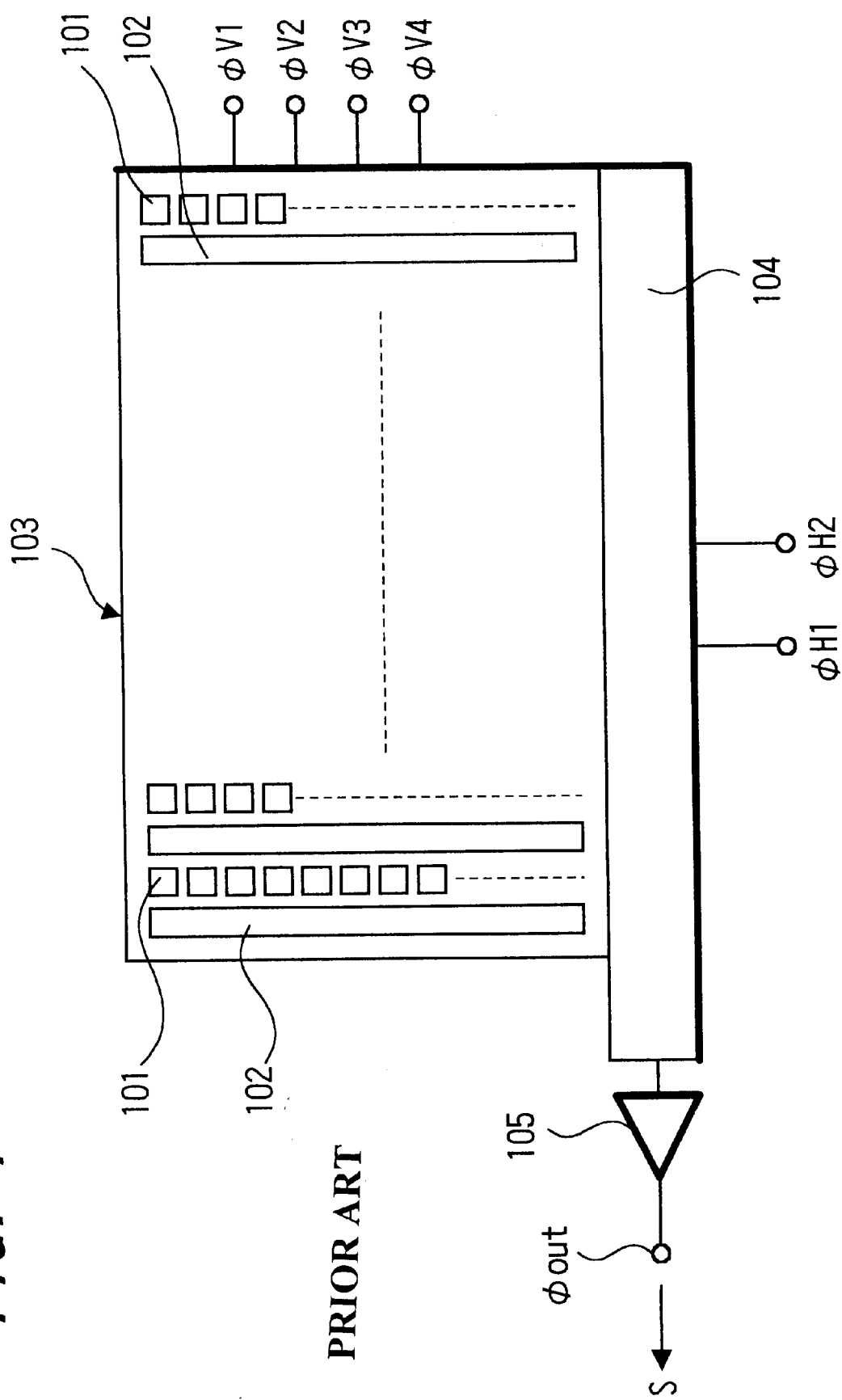
FIG. 1 is a diagram of a general four-phase drive interline transfer CCD image sensor.
Figure 2:
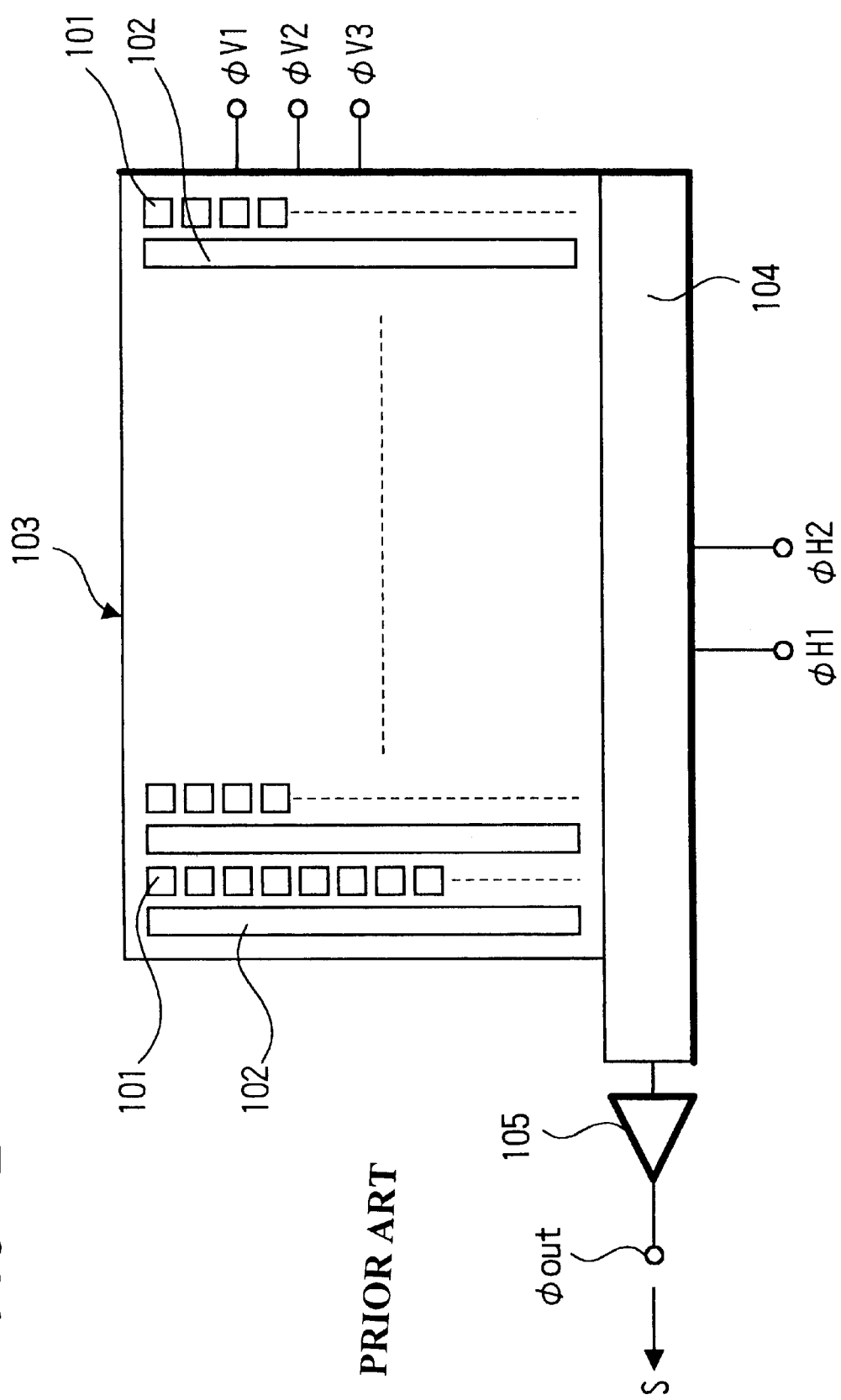
FIG. 2 is a diagram of a general three-layer three-phase all-pixel reading CCD image sensor.
Figure 3:
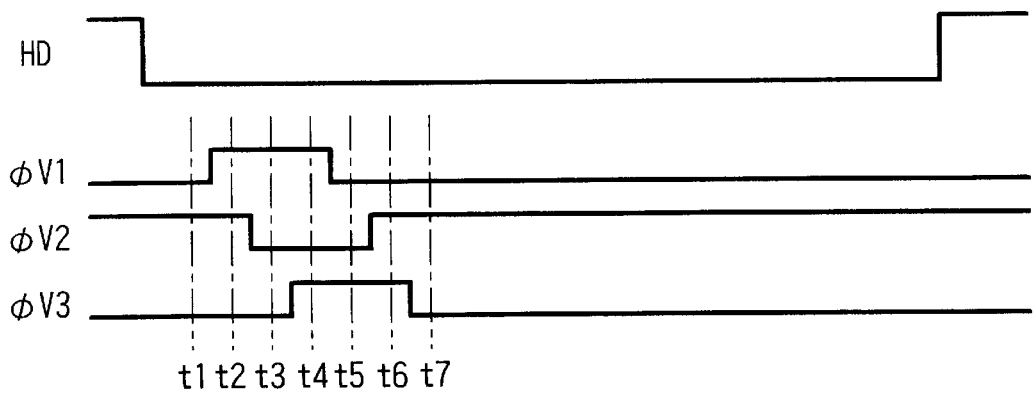
FIG. 3 is a timing chart showing first through third vertical transfer pulses used in a vertical transfer process of the three-layer three-phase all-pixel reading CCD image sensor.
Figure 4:
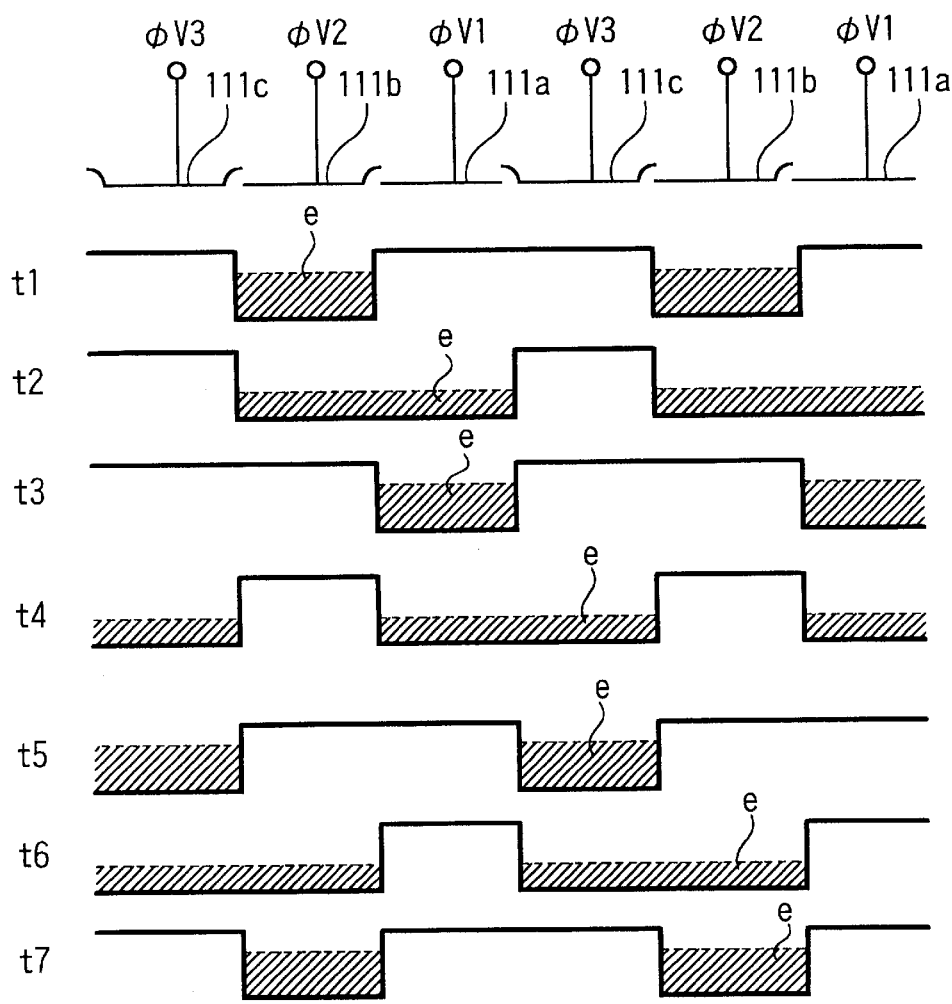
FIG. 4 is a diagram illustrating the vertical transfer process of the three-layer three-phase all-pixel reading CCD image sensor.
Figure 5:
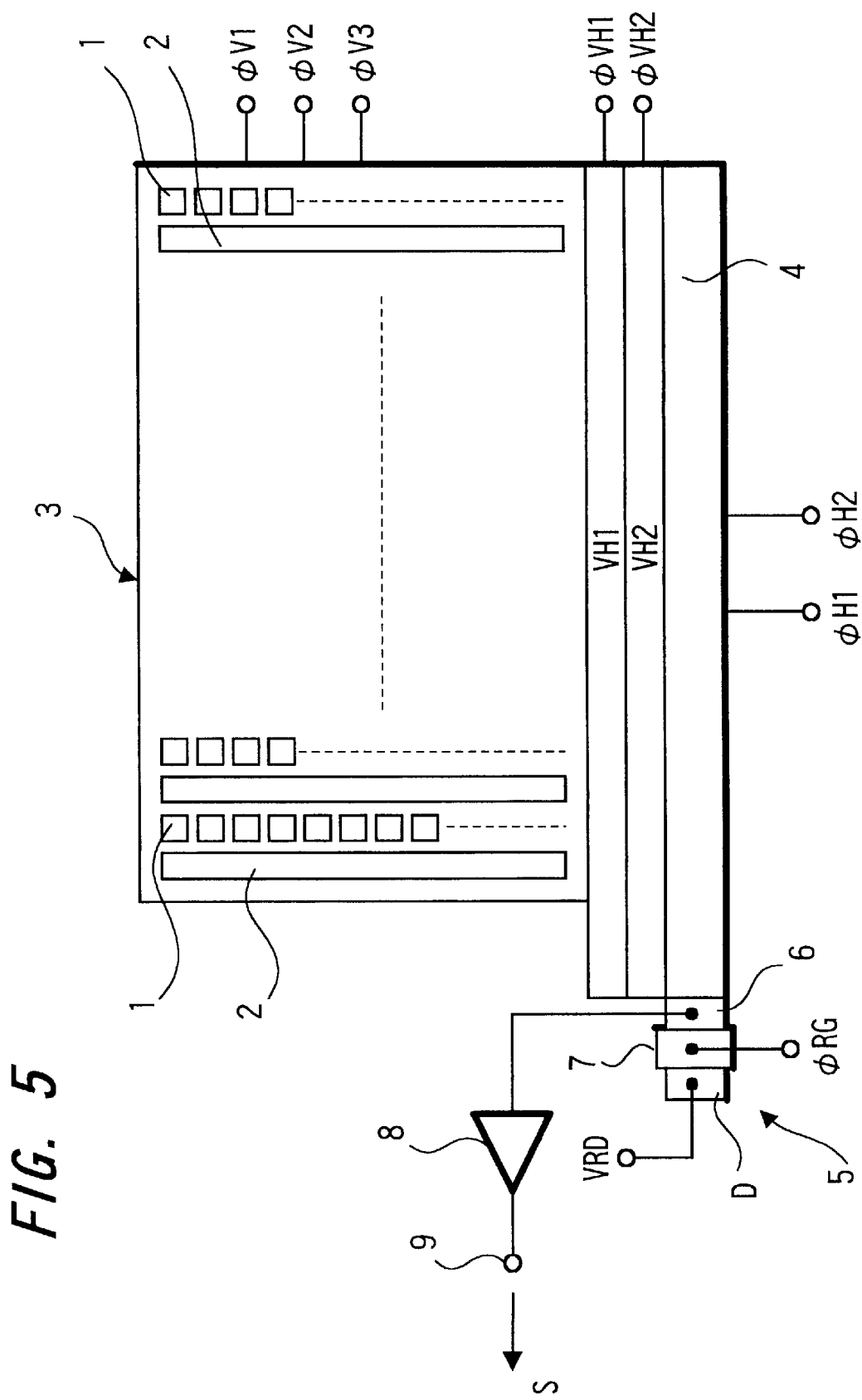
FIG. 5 is a diagram of an embodiment in which a solid-state imaging device according to the present invention is applied to a three-layer three-phase all-pixel reading CCD image sensor (hereinafter referred to as an image sensor according to an embodiment of the present invention)

As shown in FIG. 5, an image sensor according to an embodiment of the present invention has an imaging unit 3 comprising a matrix of photodetectors 1 for photoelectrically converting incident light into electric charges depending on the amount of the incident light and a number of vertical shift registers 2 shared by columns of photodetectors 1 and arranged along rows of photodetectors 1.

The image sensor also has a horizontal shift register 4 disposed adjacent to the imaging unit 3 and shared by the vertical shift registers 2.

Between the imaging unit 3 and the horizontal shift register 4, there are disposed two vertical-horizontal shift registers VH1, VH2 shared by the vertical shift registers 2 and extending parallel to each other, for transferring signal charges transferred to final stages of the vertical shift registers 2 to the horizontal shift register 4. The two vertical-horizontal shift registers VH1, VH2 will be supplied with respective vertical-horizontal transfer pulses φVH1, φVH2. When the two vertical-horizontal shift registers VH1, VH2 are supplied with respective vertical-horizontal transfer pulses φVH1, φVH2, the signal charges from the vertical transfer registers 2 are transferred to the horizontal shift register 4.

An output unit 5 is connected to a final stage of the horizontal shift register 4. The output unit 5 has a charge-to-voltage converter 6 comprising a floating-diffusion device or a floating-gate device for converting a signal charge transferred from the final stage of the horizontal shift register 4 to an electric signal, e.g., a voltage signal, a reset gate 7 for draining a signal charge, after it has been converted to an electric signal by the charge-to-voltage converter 6, into a drain region D in response to a reset pulse fRG, and an amplifier 8 for amplifying an electric signal from the charge-to-voltage converter 6. A power supply voltage VRD is applied to the drain region D.

When vertical transfer pulses φV1~φV3 in three phases are supplied to the imaging unit 3, a distribution of potentials under respective vertical transfer electrodes of the imaging unit 3 varies successively to transfer signal charges along the vertical shift registers 2 in a vertical direction (to the horizontal shift register 4).

In the imaging unit 3, signal charges stored in the photodetectors 1 are read into the vertical shift registers 2 in a vertical blanking period, and then transferred from each of the vertical shift registers 2 to the horizontal shift register 4 in a horizontal blanking period. The signal charges in the final stages of the vertical shift registers 2 are now transferred through the two vertical-horizontal shift registers VH1, VH2 to the horizontal shift register 4.

In a next horizontal scanning period, when horizontal transfer pulses φH1, φH2 in two different phases are applied to horizontal transfer electrodes in the form of two polycrystalline silicon layers, for example, on the horizontal shift register 4, the signal charges are successively transferred to the charge-to-voltage converter 6 of the output unit 105. The charge-to-voltage converter 6 converts the transferred signal charges into an electric signal, which is then amplified by the amplifier 7 and outputted as an image signal S from an output terminal 9.

Figure 6:
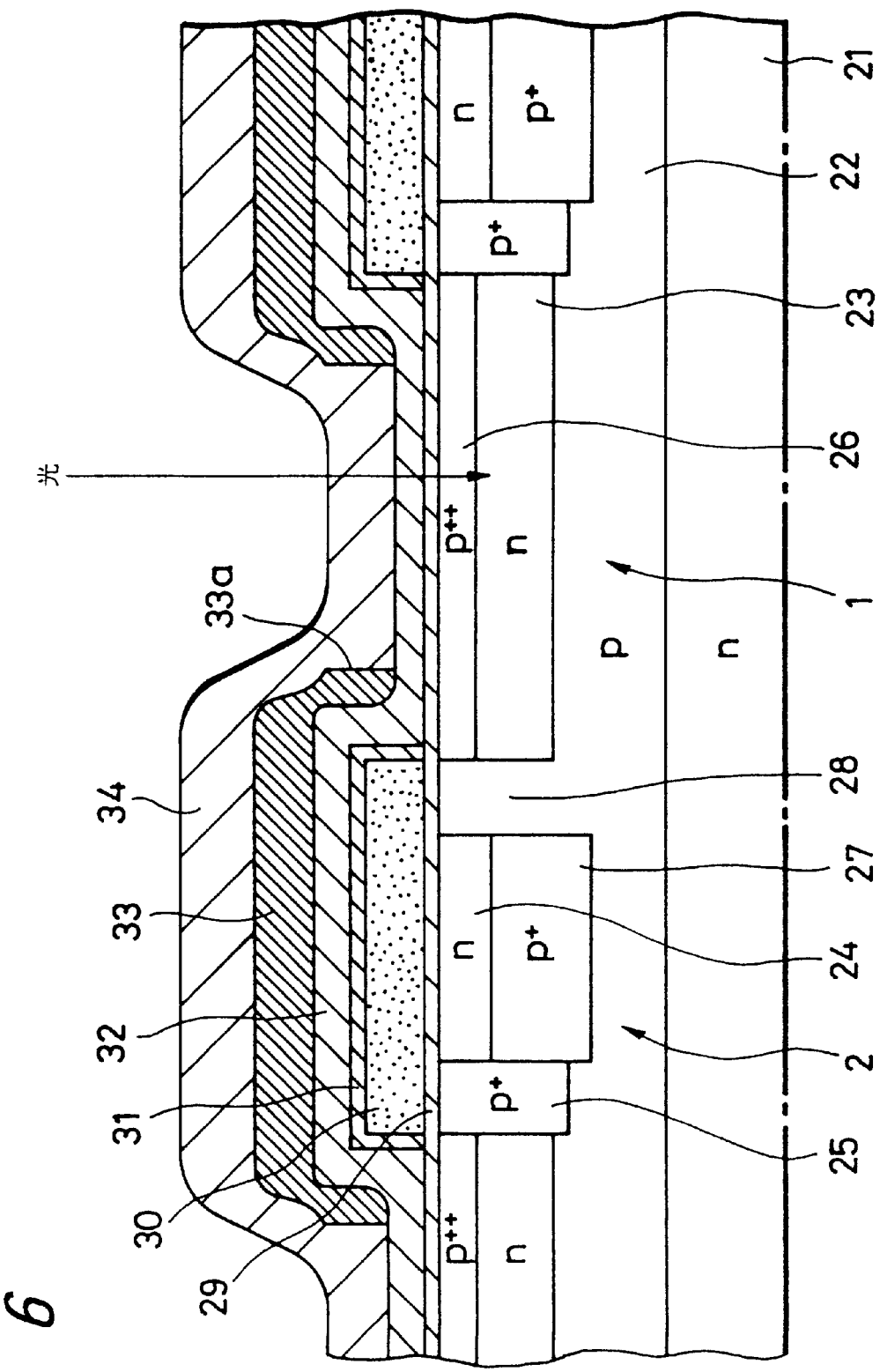
FIG. 6 is a cross-sectional view showing the structure of a photodetector and a surrounding portion of the image sensor according to the embodiment.

A fragmentary cross section of the image sensor around one of the photodetectors 1 is shown in FIG. 6. As shown in FIG. 6, the image sensor has a p-type well region 22 formed by introducing a p-type impurity (e.g., of boron (B)) into an n-type silicon substrate 21, an n-type impurity-diffused region 23 which constitutes the photodetector 1, an n-type transfer channel region 24 and a p-type channel stopper region 25 which constitute a vertical shift register 2, a p-type positive charge storage region 26 formed on a surface of the n-type impurity-diffused region 23, and a second p-type well region 27 formed directly underneath the n-type transfer channel region 24 for the purpose of reducing smear. A p-type region between the n-type impurity-diffused region 23 and the n-type transfer channel region 24 serves as a readout gate 28.

In the image sensor, as shown in FIG. 6, the p-type well region 22 is formed on a surface of the n-type silicon substrate 21, and the n-type impurity-diffused region 23 which constitutes the photodetector 1 is formed in a position shallower than the well region 22. The image sensor thus constructed functions as a so-called electronic shutter.

Specifically, when a substrate potential supplied to the silicon substrate 21 is brought into a high level in synchronism with a shutter pulse, a potential barrier (overflow barrier) in the p-type well region 22 is lowered, allowing a charge (in this case, electrons) stored in the photodetector 1 to flow over the overflow barrier vertically, i.e., drain to the silicon substrate 21. Therefore, a period from the time when the shutter pulse is finally applied to the time when the charge is read serves as a virtual exposure period thereby to prevent a drawback such as an afterimage lag or the like.

The n-type impurity-diffused region 23 and the p-type well region 22 jointly form a pn junction serving as a photodiode. The n-type impurity-diffused region 23 and the readout gate 28 jointly form a pn junction serving as a photodiode. The n-type impurity-diffused region 23 and the channel stopper region 25 jointly form a pn junction serving as a photodiode. The n-type impurity-diffused region 23 and the p-type hole storage region 26 jointly form a pn junction serving as a photodiode. These photodiodes make up the photodetector 1 (photoelectric transducer). A number of such photodetectors 1 are arranged in a matrix in the imaging unit 3.

The image sensor is of a color imaging type and hence has color filters (not shown) arranged in a predetermined coding pattern on the imaging unit 3. Each of the color filters is assigned one color with respect to one of the photodetectors 1.

Figure 7:
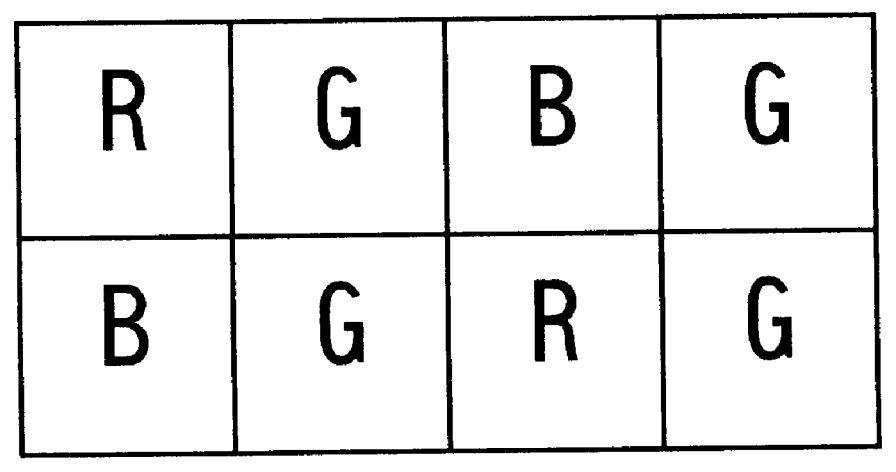

As shown in FIG. 7, the color filters of the image sensor are arranged in a so-called G-stripe R/B grid coding pattern in which a plurality of blocks each comprising R, G, B, G color filters arranged successively horizontally are arrayed in a horizontal direction along each odd-numbered line, and a plurality of blocks each comprising B, G, R, G color filters arranged successively horizontally are arrayed in a horizontal direction along each even-numbered line.

As shown in FIG. 6, the image sensor includes a three-layer gate insulating film 29 comprising an SiO2 film, an Si3N4 film, and an SiO2 film, for example, and disposed on the transfer channel region 24, the channel stopper region 25, and the readout gate 28, and three transfer electrodes (only a representative transfer electrode 30 as a first polycrystalline silicon layer is shown in FIG. 6) as first through third polycrystalline silicon layers are disposed on the gate insulating film 29. The transfer channel region 24, the channel stopper region 25, and the readout gate 28 jointly serve as the vertical shift register 2.

A silicon oxide film (SiO2 film) 31 is formed on a surface of the transfer electrode 30 by thermal oxidation. An interlayer insulating film 32 comprising PSG is disposed on the entire surface including the transfer electrode 30. A light shield film 33 comprising an Al film (hereinafter referred to as an Al light shield film) 33 is disposed on the interlayer insulating film 32 in covering relation to the lower transfer electrode 30. A protective film (e.g., an SiN film or the like formed by plasma CVD) 34 is disposed on the entire surface including the Al light shield film 33.

The Al light shield film 33 is selectively etched away to form an opening 33a on the photodetector 1. Light will be applied through the opening 33a to the photodetector 1.

In the cross-sectional view shown in FIG. 6, a planarization film, color filters, and a micro condensing lens on the protective film 34 are omitted from illustration for the sake of brevity.

A process of reading signal charges from the image sensor, particularly, a process of transferring signal charges vertically after the signal charges have been read into the vertical shift registers 2, will be described below with reference to timing charts and diagrams shown in FIGS. 8 through 12.

Figure 8:
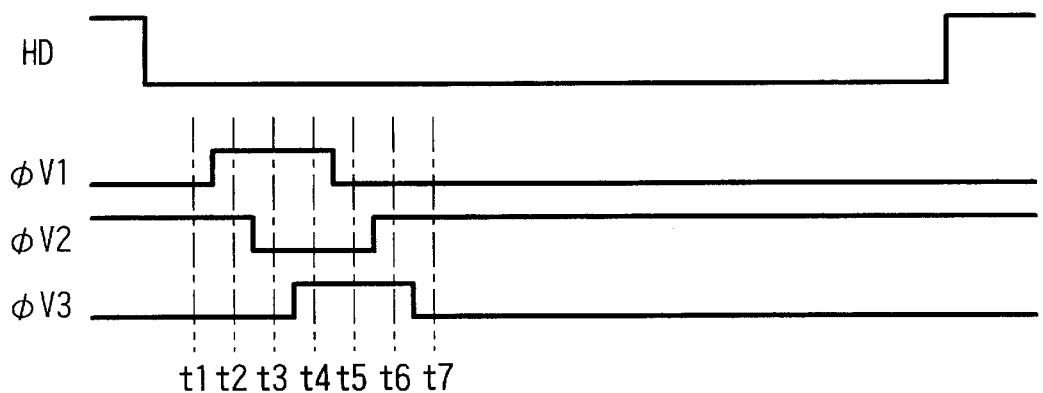
FIG. 8 is a timing chart showing first through third vertical transfer pulses used in a vertical transfer process in the three-layer three-phase CCD image sensor.
Figure 9:
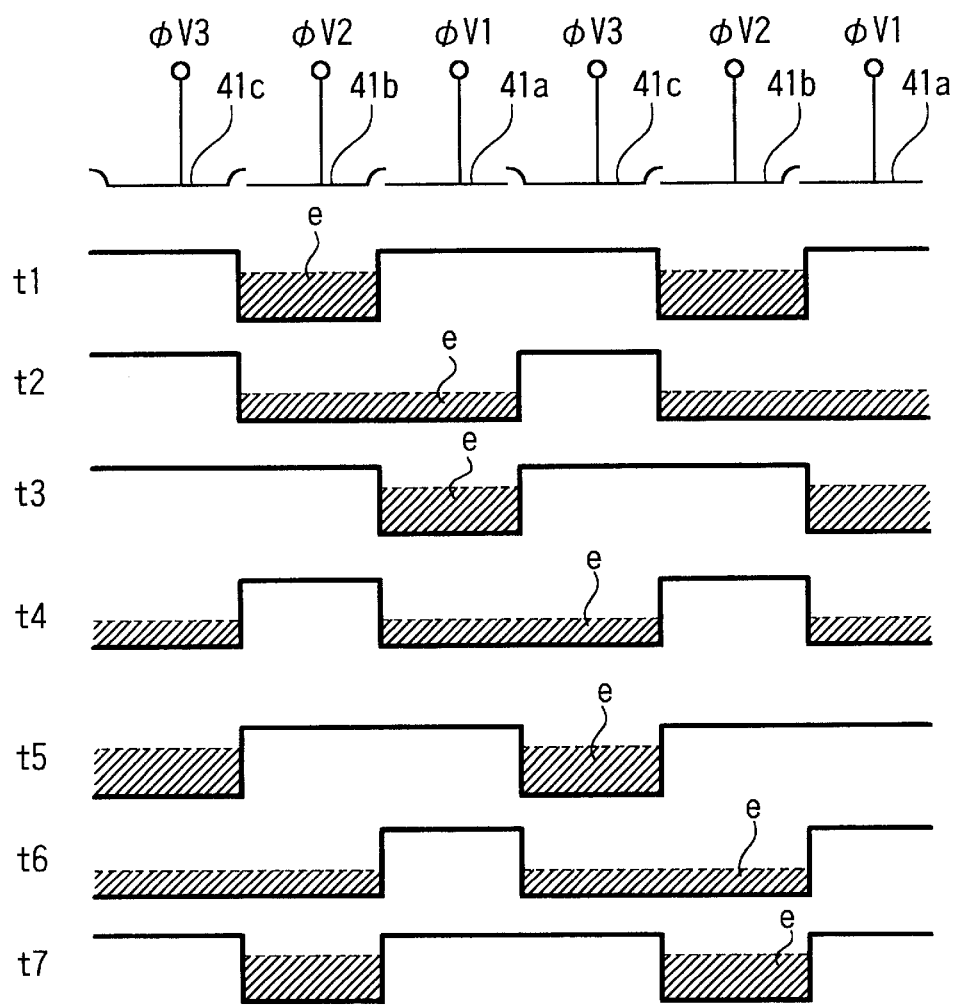
FIG. 9 is a diagram illustrative of the vertical transfer process in the three-layer three-phase CCD image sensor.

The process of transferring signal charges vertically is carried out basically according to the timing shown in FIG. 8. Specifically, as shown in FIG. 9, a signal charge "e" is transferred to and stored in a potential well formed beneath a second vertical transfer electrode 41b at a time t1. At a next time t2, since a first vertical transfer pulse φV1 is of a high level, a potential well is formed beneath a first vertical transfer electrode 41a. The signal charge "e" after it is read is transferred to and stored in the potential wells that are consecutively formed beneath the first and second vertical transfer electrodes 41a, 41b.

At a next time t3, since a second vertical transfer pulse φV2 is of a low level, a potential barrier is formed beneath the second vertical transfer electrode 41b. The signal charge "e" is transferred to and stored in the potential well that is formed beneath the first vertical transfer electrode 41a.

At a next time t4, since a third vertical transfer pulse φV3 is of a high level, a potential well is formed beneath a third vertical transfer electrode 41c. The signal charge "e" is transferred to and stored in the potential wells that are consecutively formed beneath the first and third vertical transfer electrodes 41a, 41c.

At a next time t5, since the first vertical transfer pulse φV1 is of a low level, a potential barrier is formed beneath the first vertical transfer electrode 41a. The signal charge "e" is transferred to and stored in the potential well that is formed beneath the third vertical transfer electrode 41c.

At a next time t6, since the second vertical transfer pulse φV2 is of a high level, a potential well is formed beneath the second vertical transfer electrode 41b. The signal charge "e" is transferred to and stored in the potential wells that are consecutively formed beneath the second and third vertical transfer electrodes 41b, 41c.

At a next time t7, since the third vertical transfer pulse φV3 is of a low level, a potential barrier is formed beneath the third vertical transfer electrode 41c. The signal charge "e" is transferred to and stored in the potential well that is formed beneath the second vertical transfer electrode 41b.

At this time, the signal charge "e" that has been stored in the second vertical transfer electrode 41b in the previous stage is transferred to the second vertical transfer electrode 41b in the next stage. In this manner, the first through third vertical transfer pulses φV1~φV3 are applied respectively to the vertical transfer electrodes 41a~41c, independently transferring the signal charges "e" of all the pixels successively in the vertical direction.

Figure 10:
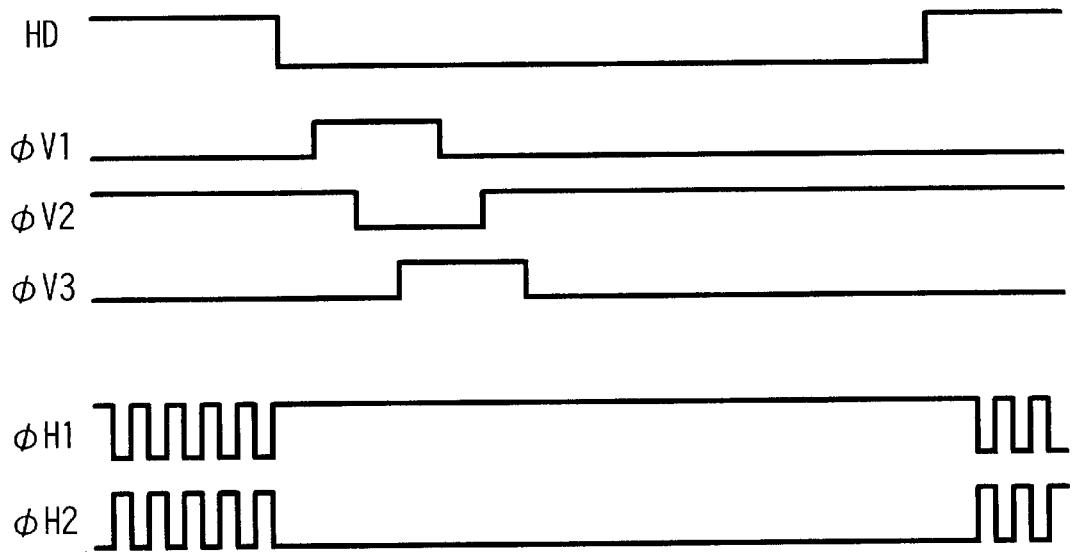
FIG. 10 is a timing chart showing first through third vertical transfer pulses and first and second horizontal transfer pulses which have a first signal configuration and are supplied to the image sensor according to the embodiment.

In the image sensor, the first through third vertical transfer pulses φV1~φV3 that are supplied to the vertical transfer electrodes 41a~41c have two signal configurations. According to the first signal configuration, as shown in FIG. 10, the first through third vertical transfer pulses φV1~φV3 shown in FIG. 8 are outputted only once in a horizontal blanking period. According to the second signal configuration, as shown in FIG. 11, the first through third vertical transfer pulses φV1~φV3 shown in FIG. 8 are outputted twice in a horizontal blanking period.

Figure 11:
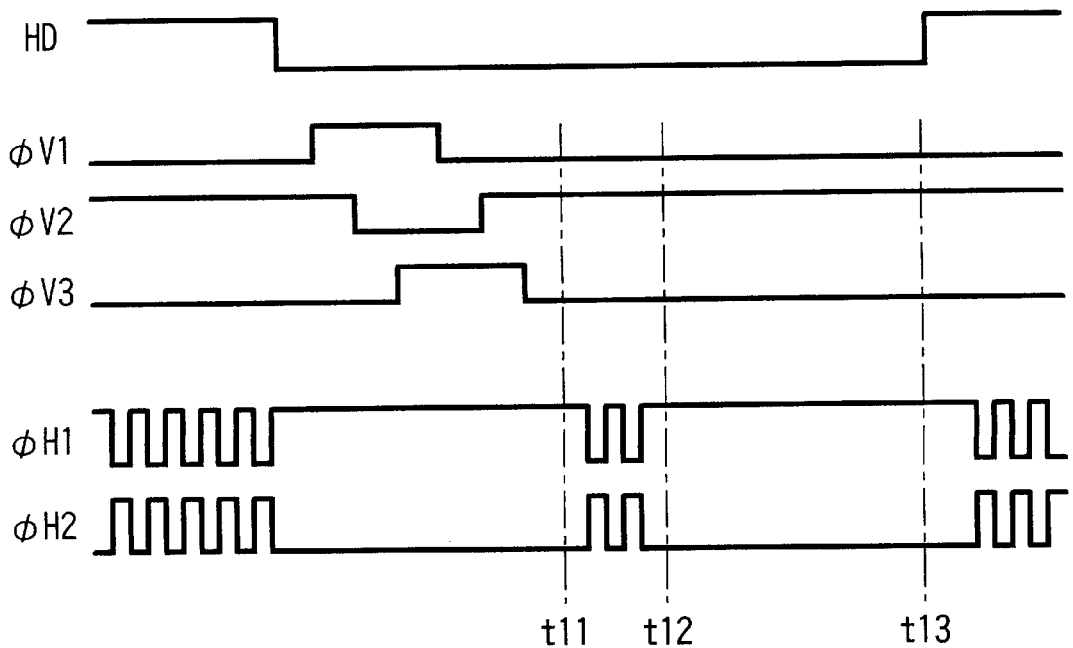
FIG. 11 is a timing chart showing first through third vertical transfer pulses and first and second horizontal transfer pulses which have a second signal configuration and are supplied to the image sensor according to the embodiment.

According to the second signal configuration shown in FIG. 11, therefore, signal charges of two lines are transferred independently of each other to the horizontal shift register 4, in which they are mixed with each other. More accurately, signal charges of two pixels in the vertical direction are mixed with each other in the horizontal shift register 4.

In the second signal configuration, particularly, the first and second horizontal transfer pulses φH1, φH2 are outputted, two pulses each, after the first through third vertical transfer pulses φV1~φV3 are outputted in a first cycle. Upon supply of the first and second horizontal transfer pulses φH1, φH2, the signal charges of two pixels stored in the horizontal shift register 4 are transferred (shifted) to the output unit 5.

Figure 12A:
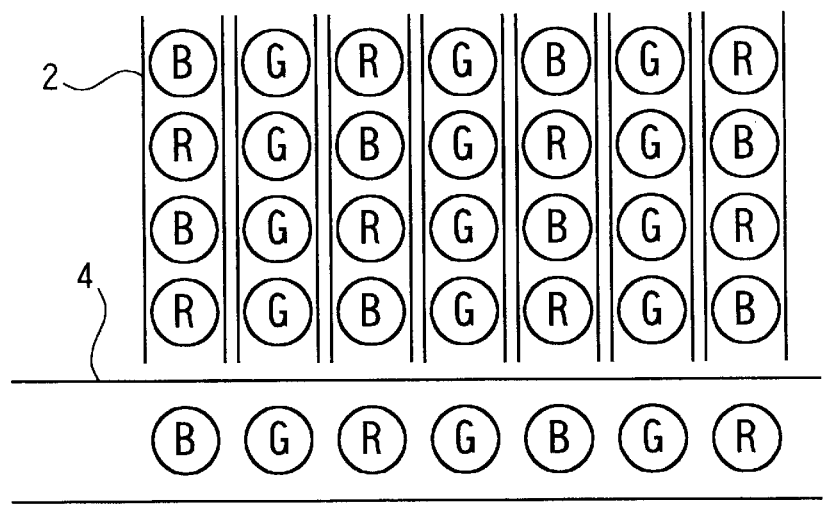
FIGS. 12A to 12C are diagrams illustrating operations of the image sensor according to the embodiment for outputting an interlaced signal.

A process of transferring the signal charges according to the second signal configuration will specifically be described below with reference to FIGS. 11 and 12. Since the first through third vertical transfer pulses φV1~φV3 in the first cycle are supplied to the imaging unit 3, the signal charges of the pixels are transferred independently of each other in each line to the horizontal shift register 4 at a time t11 in FIG. 11. As shown in FIG. 12A, signal charges of an nth line, for example, are transferred to and stored in the horizontal shift register 4. In FIG. 12, "R" represents a signal charge of a red pixel, "B" a signal charge of a blue pixel, and "G" a signal charge of a green pixel.

Figure 12B:
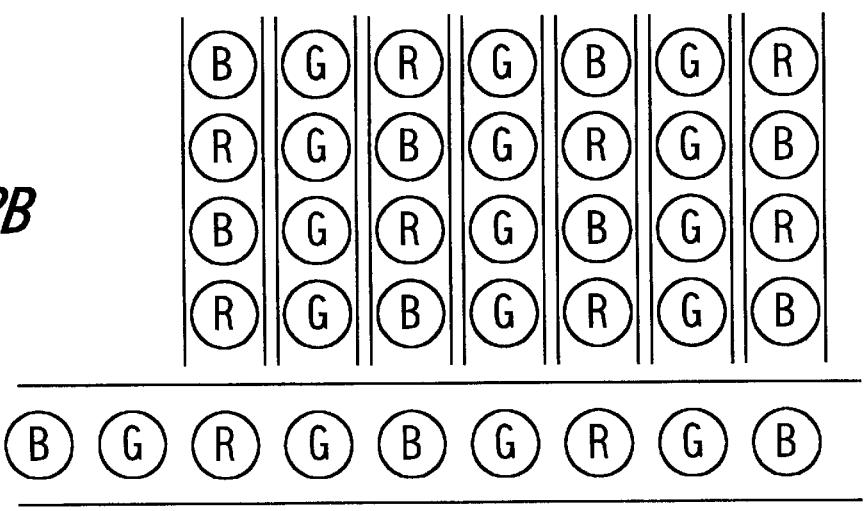

Thereafter, since the first and second horizontal transfer pulses φH1, φH2 are supplied, two pulses each, to the horizontal shift register 4, signal charges of two pixels of the nth line in the horizontal shift register 4 are shifted toward the output unit 5 as shown in FIG. 12B at a time t12 in FIG. 11.

The color filters used in the image sensor are of the G-stripe R/B grid coding pattern as shown in FIG. 7. It can be seen that when the color filters along the odd-numbered line are spatially shifted two pixels toward the output unit 5, the repetitive pattern of the colors along the odd-numbered line becomes the same as the repetitive pattern of the colors along the even-numbered line.

Consequently, when the signal charges of the nth line are shifted two pixels in the horizontal shift register 4 toward the output unit 5, the repetitive pattern of colors of signal charges in a range corresponding to the imaging unit 3 and the repetitive pattern of colors of signal charges of an (n+1)th line stored in a final stage, for example, of the imaging unit 3, out of the signal charges of the nth line stored in the horizontal shift register 4, become the same as each other.

Figure 12C:
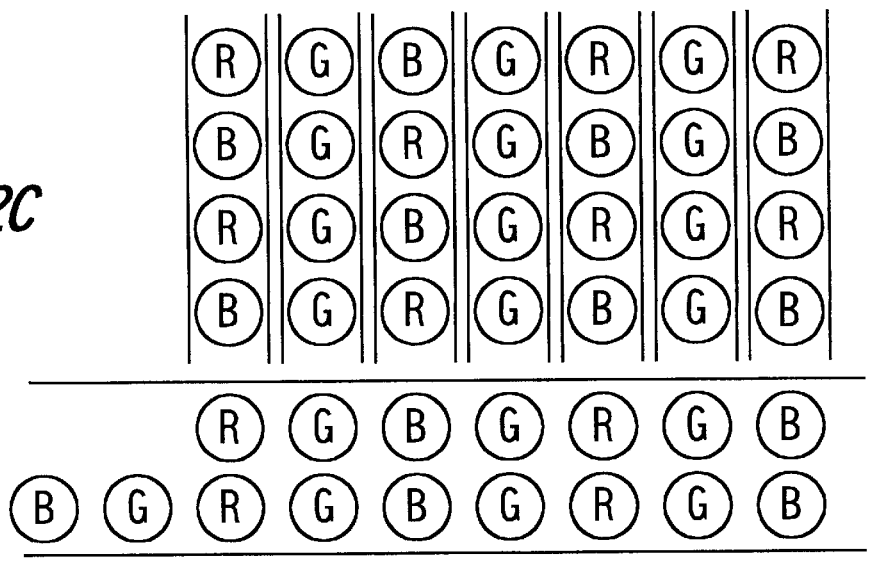

Subsequently, inasmuch as the first through third vertical transfer pulses φV1~φV3 are supplied in a second cycle, the signal charges of the respective pixels are transferred in each line to the horizontal shift register 4 at a time t13 in FIG. 11, whereupon the signal charges of the (n+1)th line are transferred to and stored in the horizontal shift register 4. As a result, as shown in FIG. 12C, the signal charges of the nth line and the signal charges of the (n+1)th line are mixed with each other in the horizontal shift register 4.

Since the repetitive pattern of colors of the signal charges of the nth line and the repetitive pattern of colors of the signal charges of the (n+1)th line are the same as each other, the same colors are mixed with each other. Therefore, two pixels in the vertical direction for producing an interlaced signal are mixed in the horizontal shift register 4.

In a horizontal scanning period after the end of a vertical transfer process, therefore, the output unit 5 outputs an R signal, a G signal, a B signal, and a G signal in the order named, making it possible to generate a color signal to produce a video signal in a subsequent signal processing stage. Accordingly, it is possible to output a field image with half as many as scanning lines in the vertical direction by employing the image sensor driving system according to the second signal configuration.

Although not shown in FIG. 11, the image sensor according to the embodiment of the present invention outputs the first through third vertical transfer pulses φV1~φV3 in the first cycle to the imaging unit 3 in an arbitrary horizontal blanking period in every other vertical blanking period according to the second signal configuration. In a vertical transfer process in the case where the first through third vertical transfer pulses φV1~φV3 are not supplied in a vertical blanking period, signal charges are transferred from the first line to the horizontal shift register 4. In a vertical transfer process in the case where the first through third vertical transfer pulses φV1~φV3 are supplied in a vertical blanking period, signal charges are transferred from the second line to the horizontal shift register 4.

Specifically, in the period of an odd-numbered field, signal charges from the first and second lines, for example, are mixed with each other in horizontal shift register 4. In the period of a next even-numbered field, since the first through third vertical transfer pulses φV1~φV3 have been supplied in a vertical blanking period prior to the period of the even-numbered field to output signal charges of one line, signal charges from the second and third lines, for example, are mixed with each other in horizontal shift register 4.

As a consequence, the output terminal 9 of the output unit 3 outputs an interlaced imaging signal S having odd- and even-numbered fields.

Accordingly, when the first through third vertical transfer pulses φV1~φV3 (see FIG. 10) which have the first signal configuration are supplied in a horizontal blanking period to the image sensor according to the embodiment, which is of the all-image reading type, the image sensor outputs a noninterlaced signal SNIL. When the first through third vertical transfer pulses φV1~φV3 (see FIG. 11) which have the second signal configuration are supplied in a horizontal blanking period to the image sensor according to the embodiment, which is of the all-image reading type, the image sensor outputs an interlaced signal SIL. The image sensor according to the embodiment is capable of selectively outputting an interlaced signal without the use of a frame memory or the like as an external circuit.

Figure 13:
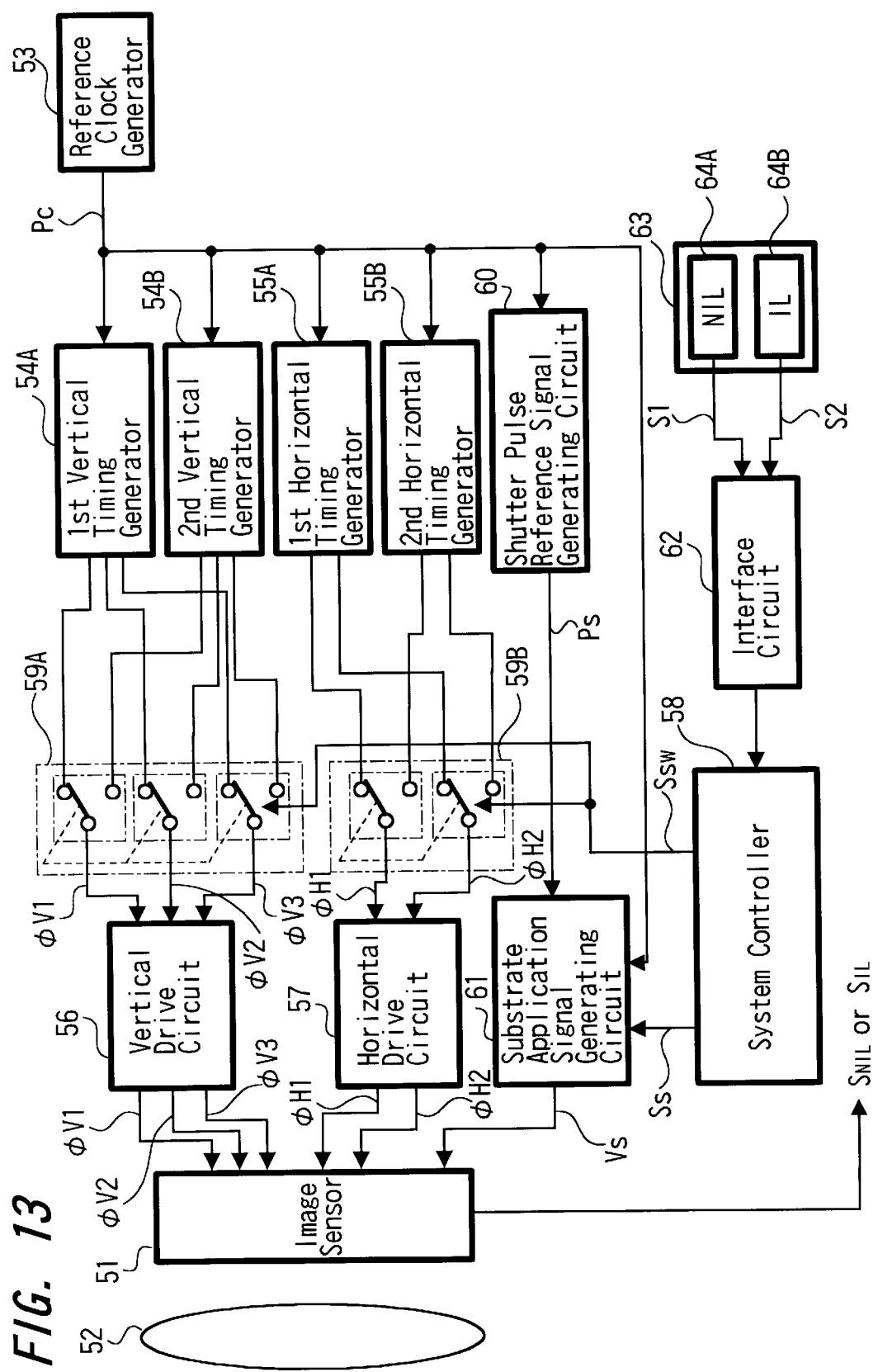
FIG. 13 is a block diagram of a camera device which incorporates the image sensor according to the embodiment.

A transfer pulse supply circuit system for supplying various transfer pulses to the image sensor according to the embodiment will be described with reference to FIG. 13. The transfer pulse supply circuit system, an image sensor 51, and an imaging lens 52 serve as main components of a camera device according to an embodiment of the present invention.

The transfer pulse supply circuit system has a reference clock generator 53 for generating a reference clock signal Pc which is determined according to specifications of the camera device, a first vertical timing generating circuit 54A for generating first through third vertical transfer pulses φV1~φV3 according to the first signal configuration shown in FIG. 10 based on the reference clock signal Pc inputted from the reference clock generator 53, a second vertical timing generating circuit 54B for generating first through third vertical transfer pulses φV1~φV3 according to the second signal configuration shown in FIG. 11 based on the reference clock signal Pc, a first horizontal timing generating circuit 55A for generating first and second horizontal transfer pulses φH1, φH2 according to the first signal configuration shown in FIG. 10 based on the reference clock signal Pc, and a second horizontal timing generating circuit 55B for generating first and second horizontal transfer pulses φH1, φH2 according to the second signal configuration shown in FIG. 11 based on the reference clock signal Pc.

The transfer pulse supply circuit system also has a vertical drive circuit 56 connected for preventing deterioration of the first through third vertical transfer pulses φV1~φV3 outputted from the first or second vertical timing generating circuit 54A or 54B, a horizontal drive circuit 57 connected for preventing deterioration of the first and second horizontal transfer pulses φH1, φH2 outputted from the first or second horizontal timing generating circuit 55A or 55B, a first switching circuit 59A for selectively switching the first through third vertical transfer pulses φV1~φV3 outputted from the first vertical timing generating circuit 54A and the first through third vertical transfer pulses φV1~φV3 outputted from the second vertical timing generating circuit 54B based on a switching control signal Ssw from a system controller 58, and a second switching circuit 59B for selectively switching the first and second horizontal transfer pulses φH1, φH2 outputted from the first horizontal timing generating circuit 55A and the first and second horizontal transfer pulses φH1, φH2 outputted from the second horizontal timing generating circuit 55B based on the switching control signal Ssw from the system controller 58.

When the switching control signal Ssw is of a high level, for example, the first switching circuit 59A selects the first through third vertical transfer pulses φV1~φV3 according to the first signal configuration from the first vertical timing generating circuit 54A, and the second switching circuit 59B selects the first and second horizontal transfer pulses φH1, φH2 according to the first signal configuration from the first horizontal timing generating circuit 55A.

The transfer pulse supply circuit system further has, in addition to the above circuits, a shutter pulse reference signal generating circuit 60 for generating a reference signal Ps to produce an electronic shutter pulse in synchronism with a horizontal blanking period, and a substrate application signal generating circuit 61 for generating a shutter pulse based on the reference signal Ps from the shutter pulse reference signal generating circuit 60, the reference clock signal Pc, and a shutter control signal Ss from the system controller 58, and generating a substrate application signal Vs by adding the shutter pulse to a substrate potential.

To the system controller 58, there are connected control keys on a control panel 63 external to the camera device through an interface circuit 62. While the control keys include many various control keys, only an NIL control key 64A for indicating a noninterlaced signal and an IL control key 64B for indicating an interlaced signal are illustrated in FIG. 13.

Processing operation of the camera device will be described below. First, when the power supply of the camera device is turned on, a high-level switching control signal Ssw is automatically outputted from the system controller 58.

Based on the high-level switching control signal Ssw from the system controller 58, the first switching circuit 59A selects the first through third vertical transfer pulses φV1~φV3 from the first vertical timing generating circuit 54A. The first through third vertical transfer pulses φV1~φV3 are supplied through the vertical drive circuit 56 to the image sensor 51.

Based on the high-level switching control signal Ssw from the system controller 58, the second switching circuit 59B selects the first and second horizontal transfer pulses φH1, φH2 from the first horizontal timing generating circuit 55A. The first and second horizontal transfer pulses φH1, φH2 are supplied to the horizontal drive circuit 57 to the image sensor 51.

The image sensor 51 now outputs a noninterlaced signal SNIL.

When the operator then operates the IL control key 64B of the control panel, an interrupt signal S2 produced by the IL control key 64B is supplied through the interface circuit 62 to the system controller 58. In response to the supplied interrupt signal S2, the system controller 58 outputs a low-level switching control signal Ssw.

Based on the low-level switching control signal Ssw from the system controller 58, the first switching circuit 59A selects the first through third vertical transfer pulses φV1~φV3 from the second vertical timing generating circuit 54B. The first through third vertical transfer pulses φV1~φV3 are supplied through the vertical drive circuit 56 to the image sensor 51.

Based on the low-level switching control signal Ssw from the system controller 58, the second switching circuit 59B selects the first and second horizontal transfer pulses φH1, φH2 from the second horizontal timing generating circuit 55B. The first and second horizontal transfer pulses φH1, φH2 are supplied to the horizontal drive circuit 57 to the image sensor 51.

The image sensor 51 now outputs an interlaced signal SIL.

When the operator operates the NIL control key 64A of the control panel 63 while the interlaced signal SIL is being outputted, an interrupt signal S1 produced by the NIL control key 64A is supplied through the interface circuit 62 to the system controller 58. In response to the supplied interrupt signal S1, the system controller 58 outputs a high-level switching control signal Ssw again, and the image sensor 51 outputs a noninterlaced signal SNIL again.

As described above, based on the interrupt signal S1 for indicating a noninterlaced signal which is produced by the NIL control key 64A, the first through third vertical transfer pulses φV1~φV3 having the first signal configuration from the first vertical timing generating circuit 54A are supplied to the image sensor 51 in a horizontal blanking period, whereupon the image sensor 51 outputs a noninterlaced signal SNIL. Based on the interrupt signal S2 for indicating an interlaced signal which is produced by the IL control key 64B, the first through third vertical transfer pulses φV1~φV3 having the second signal configuration from the second vertical timing generating circuit 54B are supplied to the image sensor 51 in a horizontal blanking period, whereupon the image sensor 51 outputs an interlaced signal SIL. The camera device which incorporates the all-pixel reading image sensor is capable of selectively outputting an interlaced signal without the use of a frame memory or the like as an external circuit.

An electronic camera system according to an embodiment of the present invention to which the above camera device is applied will be described below with reference to FIG. 14. Those parts of the camera system which are identical to those of the camera device shown in FIG. 13 are denoted by identical reference characters, and will not be described below.

Figure 14:
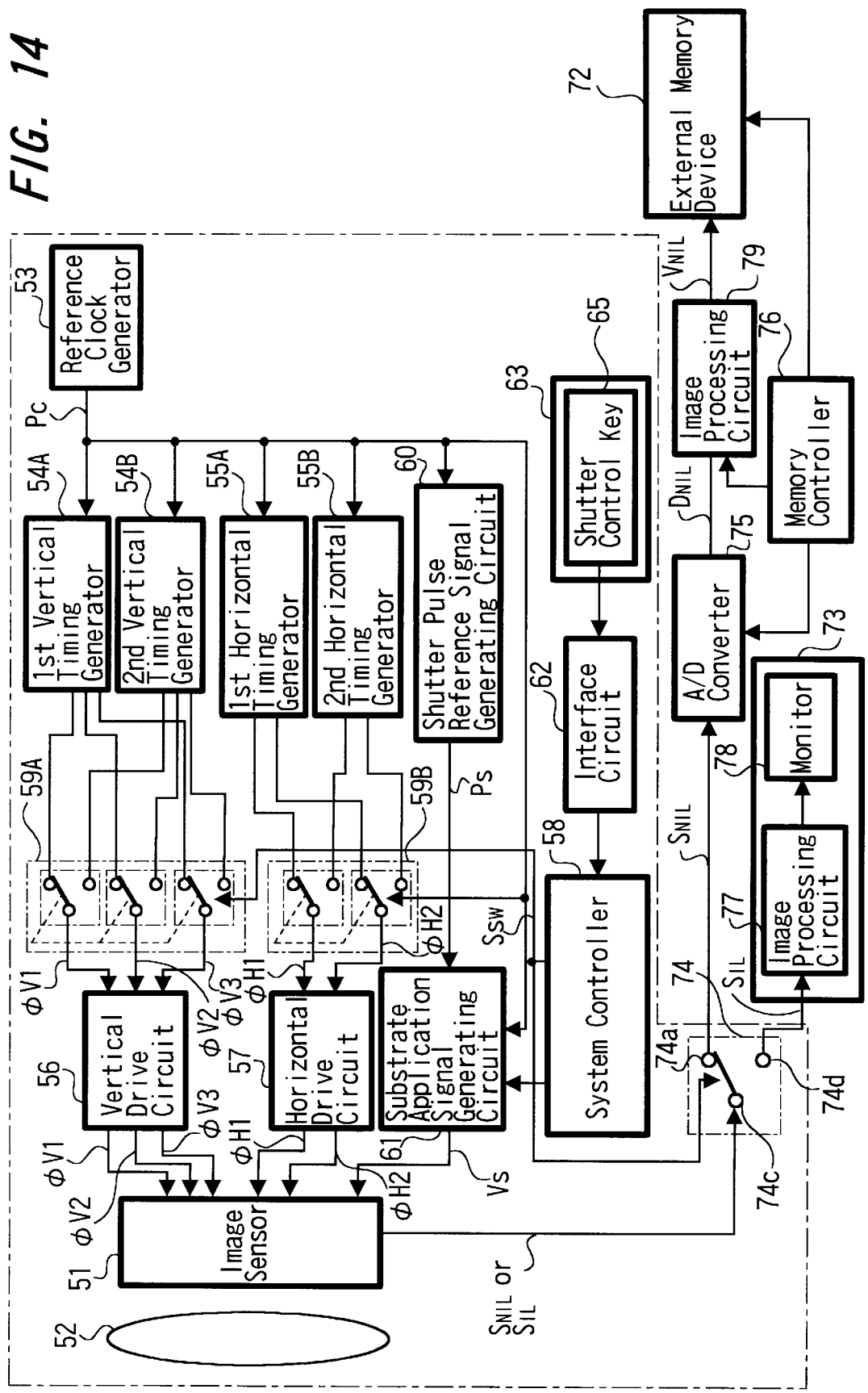
FIG. 14 is a block diagram of a camera system which incorporates the camera device according to the embodiment.

As shown in FIG. 14, the camera system according to the embodiment of the present invention has, in addition to a camera device 71 of the above structure, an external memory device 72, a display device 73, and a switching means 74. The switching means 74 is incorporated in the camera device 71, for example. The system controller 58 of the camera device 71 incorporated in the camera system differs partly from the system controller of the camera device shown in FIG. 13 in that it normally outputs a low-level switching control signal Ssw, and changes the level of the switching control signal Ssw to a high level when a shutter control key 75 of the control panel 63 is operated.

The external memory device 72 has a memory for storing at least a noninterlaced imaging signal SNIL of one frame which is outputted from the image sensor 51 of the camera device 71. To a front stage of the external memory device 72, there are connected an A/D converter 75 for converting an imaging signal SNIL outputted from the image sensor 51 into digital imaging data DNIL, and an image processing circuit 79 for adding a horizontal synchronizing signal, etc. to the imaging data DNIL from the A/D converter 75 and converting the imaging data DNIL into data for various image display modes, and outputting the data as image data VNIL. A sampling process in the A/D converter 75 and an image data converting process in the image processing circuit 79 are carried out under timing control by a memory controller 76, for example.

The image data VNIL outputted from the image processing circuit 79 are written into a memory area of the external memory device 72 in the sequence of addresses, for example, according to a write control process performed by the memory controller 76.

The display device 73 comprises an image processing circuit 77 for converting an interlaced imaging signal SIL outputted from the image sensor 51 of the camera device 71 into a video signal, and a monitor 78 for displaying the video signal from the image processing circuit 77 on a screen thereof. The image processing circuit 77 effects gamma correction and aperture correction on the imaging signal SIL and adding a horizontal synchronizing signal to the imaging signal SIL for thereby converting the imaging signal SIL into the video signal.

The switching means 74 has a first fixed contact 74a connected to the input terminal of the external memory device 72, a second fixed contact 74b connected to the input terminal of the display device 73, and a movable contact 74c connected to the output terminal of the image sensor 51 of the camera device 71. The movable contact 74c can be moved depending on the level of the switching control signal Ssw from the system controller 58. Specifically, when the switching control signal Ssw is of a low level, the movable contact 74c is shifted to supply the interlaced signal SIL outputted from the image sensor 51 to the display device 73, and when the switching control signal Ssw is of a high level, the movable contact 74c is shifted to supply the noninterlaced signal SNIL outputted from the image sensor 51 to the A/D converter 75.

Processing operation of the camera system will be described below. First, when the power supply of the camera device 71 is turned on, a low-level switching control signal Ssw is automatically outputted from the system controller 58.

Based on the low-level switching control signal Ssw from the system controller 58, the first switching circuit 59A selects the first through third vertical transfer pulses φV1~φV3 having the second signal configuration from the second vertical timing generating circuit 54B. The first through third vertical transfer pulses φV1~φV3 are supplied through the vertical drive circuit 56 to the image sensor 51.

Based on the low-level switching control signal Ssw from the system controller 58, the second switching circuit 59B selects the first and second horizontal transfer pulses φH1, φH2 having the second signal configuration from the second horizontal timing generating circuit 55B. The first and second horizontal transfer pulses φH1, φH2 are supplied to the horizontal drive circuit 57 to the image sensor 51.

The image sensor 51 of the camera device 71 now outputs an interlaced signal SIL.

The low-level switching control signal Ssw from the system controller 58 is also supplied to the switching means 74. The movable contact 74c of the switching means 74 is now shifted to the second fixed contact 74b, whereupon the interlaced signal SIL from the image sensor 51 is supplied through the switching means 74 to the display device 73, which displays an interlaced video image on the screen thereof.

When the operator operates the shutter control key 65 of the control panel 63 while the interlaced signal SIL is being supplied to the display device 73, an interrupt signal produced by the shutter control key 65 is supplied through the interface circuit 62 to the system controller 58. In response to the supplied interrupt signal, the system controller 58 outputs a high-level switching control signal Ssw.

Based on the high-level switching control signal Ssw from the system controller 58, the first switching circuit 59A selects the first through third vertical transfer pulses φV1~φV3 from the first vertical timing generating circuit 54A. The first through third vertical transfer pulses φV1~φV3 are supplied through the vertical drive circuit 56 to the image sensor 51.

Based on the high-level switching control signal Ssw from the system controller 58, the second switching circuit 59B selects the first and second horizontal transfer pulses φH1, φH2 from the first horizontal timing generating circuit 55A. The first and second horizontal transfer pulses φH1, φH2 are supplied to the horizontal drive circuit 57 to the image sensor 51.

The image sensor 51 of the camera device 71 now outputs a noninterlaced signal SNIL.

The high-level switching control signal Ssw from the system controller 58 is also supplied to the switching means 74. The movable contact 74c of the switching means 74 is now shifted to the first fixed contact 74a, whereupon the noninterlaced signal SNIL from the image sensor 51 is supplied through the switching means 74 to the A/D converter 75, which converts the noninterlaced signal SNIL into digital imaging data DNIL. The digital imaging data DNIL are then converted into image data VNIL by the image processing circuit 79. The image data VNIL are then written into a given memory area of the memory of the external memory device 72 in the sequence of addresses, for example, according to a write control process performed by the memory controller 76.

If a still image, for example, is supplied to the external memory device 72, then it is necessary to shift the movable contact 74c of the switching means 74 again to the second fixed contact 74b after the noninterlaced signal SNIL of one frame has been written as image data VNIL in the memory of the external memory device 72.

To meet such a requirement, the system controller 58 counts clock pulses of the reference clock signal Pc from the reference clock signal generator 53, and shifts the level of the switching control signal Ssw to a low level when it counts clock pulses up to a value corresponding to the period in which one frame is outputted. Therefore, noninterlaced imaging data DNIL of one frame are supplied to the external memory device 72. If a moving image is supplied to the external memory device 72, then the above counting process is not necessary, but the NIL control key 64A and the IL control key 64B shown in FIG. 13 are employed to control the system controller 58 such that when the IL control key 64B is operated, the system controller 58 shifts the level of the switching control signal Ssw to a low level, and when the NIL control key 64A is operated, the system controller 58 shifts the level of the switching control signal Ssw to a high level.

Figure 15:
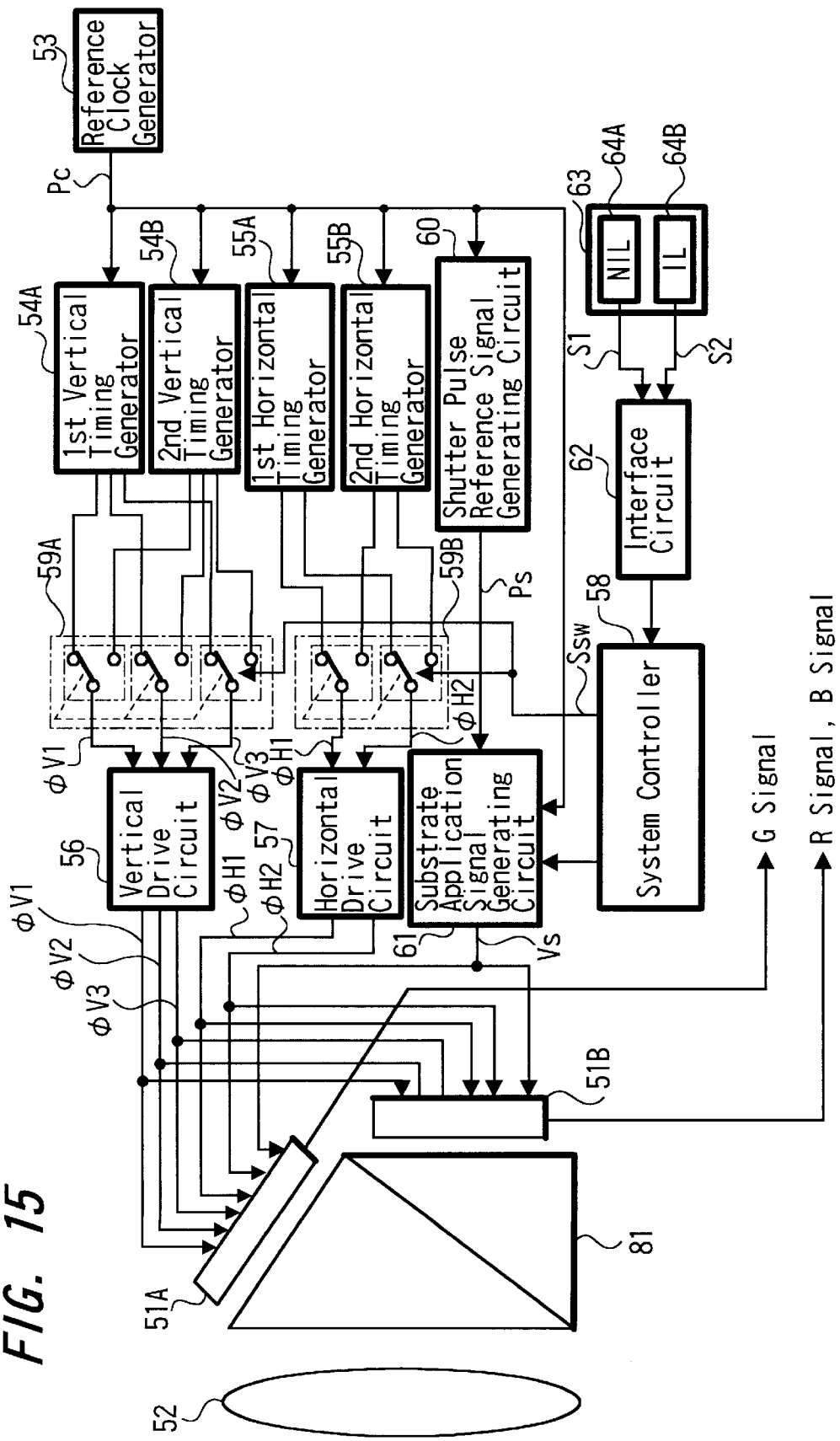
FIG. 15 is a block diagram of a two-panel camera device which incorporates the image sensor according to the embodiment.

In the above embodiment, the camera device has basically been described as comprising a single-panel camera device. However, as shown in FIG. 15, the camera device may comprise a two-panel camera device having two image sensors (first and second image sensors 51A, 51B). Those parts shown in FIG. 15 which are identical to those shown in FIG. 13 are denoted by identical reference numerals.

The two-panel camera device has a prism 81 for separating light from a subject which is applied through an imaging lens 52 into green, red, and blue components, a black-and-white-imaging first image sensor 51A disposed in a position where the green component is emitted from the prism, and a color-imaging second image sensor 51B disposed in a position where the red and blue components are emitted from the prism. The second image sensor 51B comprises a color-imaging image sensor which employs color filters arranged in an R/B grid coding pattern.

Figure 16:
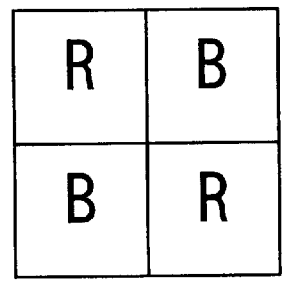
FIG. 16 is a diagram illustrative of the colors of color filters arranged in an R/B grid coding pattern which are used in a color-imaging image sensor in the two-panel camera device.

The color filters employed by the second image sensor 51B are arranged in the R/B grid coding pattern in which, as shown in FIG. 16, a plurality of blocks each comprising R, B color filters arranged successively horizontally are arrayed in a horizontal direction along each odd-numbered line, and a plurality of blocks each comprising B, R color filters arranged successively horizontally are arrayed in a horizontal direction along each even-numbered line.

The color filters arranged in the R/B grid coding pattern are such that when the color filters along the odd-numbered line are spatially shifted one pixel toward the output unit, the repetitive pattern of the colors along the odd-numbered line becomes the same as the repetitive pattern of the colors along the even-numbered line.

Figure 17:
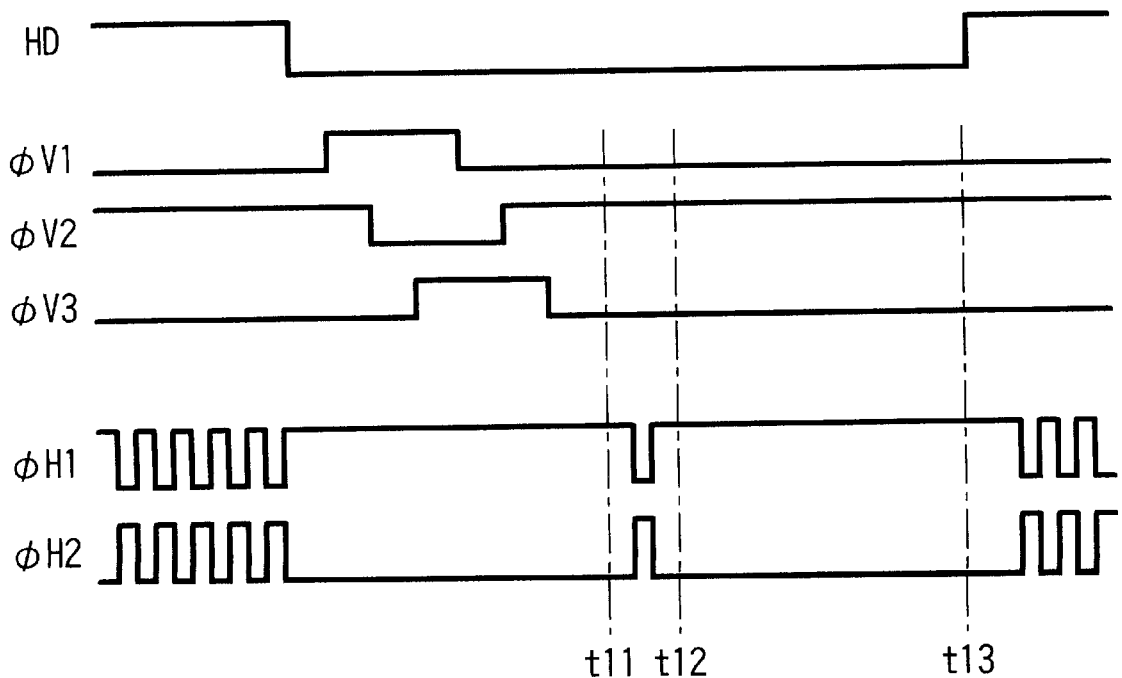
FIG. 17 is a timing chart showing first through third vertical transfer pulses and first and second horizontal transfer pulses which have a second signal configuration and are supplied to the color-imaging image sensor in the two-panel camera device.

In the two-panel camera device, therefore, transfer pulses for outputting a noninterlaced signal have a signal configuration (first signal configuration) which is the same as the signal configuration shown in FIG. 10, and transfer pulses for outputting an interlaced signal have a signal configuration (second signal configuration) as shown in FIG. 17.

Specifically, according to the second signal configuration as shown in FIG. 17, the first through third vertical transfer pulses φV1~φV3 shown in FIG. 8 are outputted in two cycles in a horizontal blanking period, and the horizontal transfer pulses φH1, φH2 are outputted, one pulse each, after the first through third vertical transfer pulses φV1~φV3 are outputted in the first cycle. When the horizontal transfer pulses φH1, φH2 are supplied, one pulse each, to the horizontal shift register 4, signal charges stored in the horizontal shift register 4 are transferred (shifted) one pixel to the output unit 5.

Figure 18A:
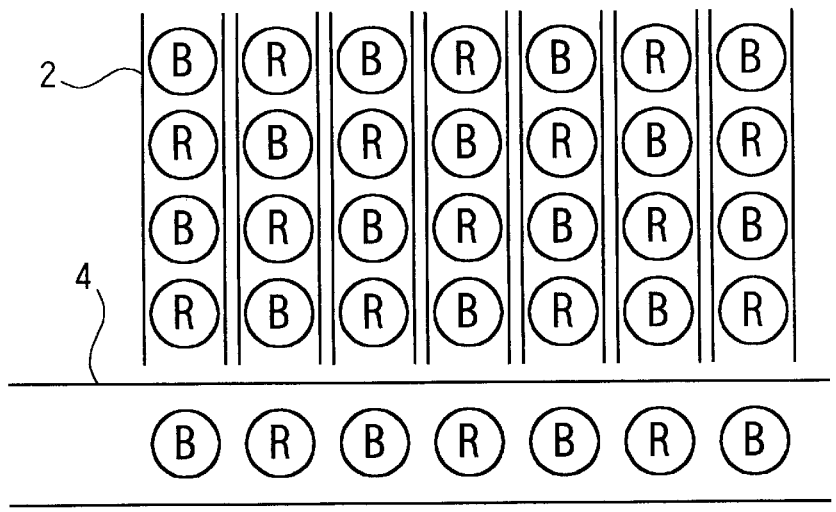
FIGS. 18A to 18C are diagrams illustrating operations of the color-imaging image sensor in the two-panel camera device for outputting an interlaced signal.

A process of transferring signal charges according to the second signal configuration will specifically be described below with reference to FIGS. 17 and 18. Since the first through third vertical transfer pulses φV1~φV3 in the first cycle are supplied to the imaging unit 3, the signal charges of the pixels are transferred independently of each other in each line to the horizontal shift register 4 at a time t11 in FIG. 17. As shown in FIG. 18A, signal charges of an nth line, for example, are transferred to and stored in the horizontal shift register 4.

Figure 18B:
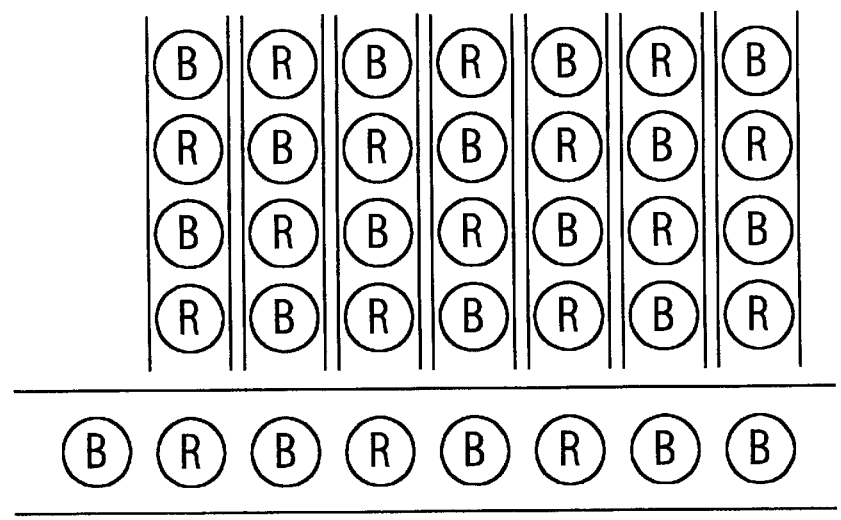

Thereafter, since the first and second horizontal transfer pulses φH1, φH2 are supplied, one pulse each, to the horizontal shift register 4, a signal charge of one pixel of the nth line in the horizontal shift register 4 is shifted toward the output unit 5 as shown in FIG. 18B at a time t12 in FIG. 17.

Consequently, the repetitive pattern of colors of signal charges in a range corresponding to the imaging unit 3 and the repetitive pattern of colors of signal charges of an (n+1)th line stored in a final stage, for example, of the imaging unit 3, out of the signal charges of the nth line stored in the horizontal shift register 4, become the same as each other.

Figure 18C:
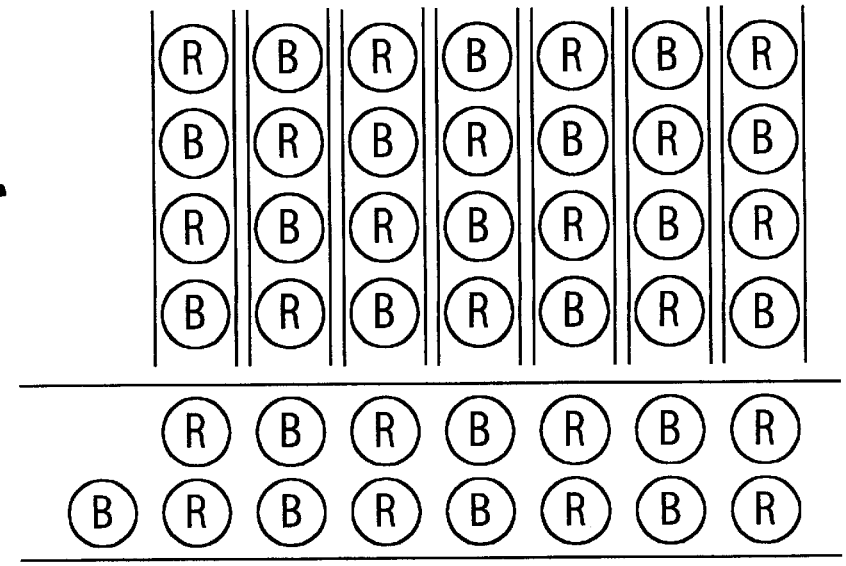

Subsequently, inasmuch as the first through third vertical transfer pulses φV1~φV3 are supplied in a second cycle, the signal charges of the respective pixels are transferred in each line to the horizontal shift register 4 at a time t13 in FIG. 17, whereupon the signal charges of the (n+1)th line are transferred to and stored in the horizontal shift register 4. As a result, as shown in FIG. 18C, the signal charges of the nth line and the signal charges of the (n+1)th line are mixed with each other in the horizontal shift register 4.

Since the repetitive pattern of colors of the signal charges of the nth line and the repetitive pattern of colors of the signal charges of the (n+1)th line are the same as each other, the same colors are mixed with each other. Therefore, two pixels in the vertical direction for producing an interlaced signal SIL are mixed in the horizontal shift register 4.

In a horizontal scanning period after the end of a vertical transfer process, therefore, the output unit 5, i.e., the output unit 5 of the second image sensor 51B, outputs an R signal and a B signal in the order named.

A G signal is produced as an output signal from the black-and-white-imaging first image sensor 51A. The first image sensor 51A is supplied with the transfer pulses which are supplied to the color-imaging second image sensor 51B. Specifically, for outputting a noninterlaced signal, the first image sensor 51A is supplied with the first through third vertical transfer pulses φV1~φV3 and the first and second horizontal transfer pulses φH1, φH2 according to the first signal configuration shown in FIG. 10. For outputting an interlaced signal, the first image sensor 51A is supplied with the first through third vertical transfer pulses φV1~φV3 and the first and second horizontal transfer pulses φH1, φH2 according to the second signal configuration shown in FIG. 17.

Because the first image sensor 51A outputs the G signal and the second image sensor 51B successively outputs the R and B signals, it is possible to generate color signals for producing a video signal in a subsequent signal processing stage.

Although not shown, the image sensors 51A, 51B output the first through third vertical transfer pulses φV1~φV3 in the first cycle to the imaging unit 3 in an arbitrary horizontal blanking period in every other vertical blanking period according to the second signal configuration. In a vertical transfer process in the case where the first through third vertical transfer pulses φV1~φV3 are not supplied in a vertical blanking period, signal charges are transferred from the first line to the horizontal shift register 4. In a vertical transfer process in the case where the first through third vertical transfer pulses φV1~φV3 are supplied in a vertical blanking period, signal charges are transferred from the second line to the horizontal shift register 4.

Specifically, in the period of an odd-numbered field, signal charges from the first and second lines, for example, are mixed with each other in horizontal shift register 4. In the period of a next even-numbered field, signal charges from the second and third lines, for example, are mixed with each other in horizontal shift register 4.

As a consequence, the first image sensor 51A and the second image sensor 51B output an interlaced signal SIL having odd- and even-numbered fields.

Accordingly, when the first through third vertical transfer pulses φV1~φV3 which have the first signal configuration shown in FIG. 10 are supplied in a horizontal blanking period to the image sensors (the first and second image sensors 51A, 51B), which are of the all-image reading type, in the two-panel camera device, the image sensors output a noninterlaced signal SNIL. When the first through third vertical transfer pulses φV1~φV3 which have the second signal configuration shown in FIG. 17 are supplied in a horizontal blanking period to the image sensors, which are of the all-image reading type, the image sensors output an interlaced signal SIL. The image sensors are capable of selectively outputting an interlaced signal without the use of a frame memory or the like as an external circuit.

In the above embodiments, the present invention is applied to the three-layer three-phase all-pixel reading CCD image sensor (particularly, the interline-transfer CCD image sensor). However, the present invention is also applicable to a frame interline transfer (FIT) image sensor or a frame transfer (FT) image sensor.

As described above, the solid-state imaging device according to the present invention has an imaging unit comprising a matrix of photodetectors as pixels for photoelectrically converting incident light from a subject into signal charges depending on the amount of the incident light, and color filters arranged on the imaging unit in a predetermined pattern corresponding to the pixels, and signal charges stored in the respective pixels are transferred in each line to a horizontal shift register based on a group of first transfer pulses supplied in a horizontal blanking period, and signal charges stored in the respective pixels are transferred in each two lines to the horizontal shift register based on a group of second transfer pulses supplied in the horizontal blanking period. Therefore, an all-pixel reading image sensor or an image sensor for outputting a noninterlaced signal may be arranged to selectively output an interlaced signal without the use of a frame memory or the like as an external circuit.

The method of driving the solid-state imaging device according to the present invention transfers signal charges stored in the respective pixels in each line to a horizontal shift register based on a group of first transfer pulses supplied in a horizontal blanking period, and transfers signal charges stored in the respective pixels in each two lines to the horizontal shift register based on a group of second transfer pulses supplied in the horizontal blanking period. Therefore, a method of driving an all-pixel reading image sensor or an image sensor for outputting a noninterlaced signal may be arranged to selectively output an interlaced signal without the use of a frame memory or the like as an external circuit.

The camera device according to the present invention has the solid-state imaging device, a first timing generating circuit for generating a group of first transfer pulses for transferring signals charges stored in the respective pixels in a horizontal blanking period in each line to a horizontal shift register, based on a reference clock signal, a second timing generating circuit for generating a group of second transfer pulses for transferring signals charges stored in the respective pixels in the horizontal blanking period in each two lines to the horizontal shift register, based on the reference clock signal, and selecting means for selecting the group of first transfer pulses as a group of transfer pulses to be supplied to the solid-state imaging device based on an external command for a noninterlaced signal, and selecting the group of second transfer pulses as a group of transfer pulses to be supplied to the solid-state imaging device based on an external command for an interlaced signal. Therefore, a camera device which incorporates an all-pixel reading image sensor or an image sensor for outputting a noninterlaced signal may be arranged to selectively output an interlaced signal without the use of a frame memory or the like as an external circuit.

The camera system according to the present invention has the camera device, an external memory device having a memory for storing an imaging signal of at least one frame which is outputted from the solid-state imaging device, a display device for converting the imaging signal outputted from the solid-state imaging device into a video signal and displaying the video signal on a screen, and switching means for supplying the imaging signal outputted from the solid-state imaging device to the display device in the normal operation, and switching to supply the imaging signal outputted from the solid-state imaging device to the external memory device based on the interrupt signal from the external shutter control key. Therefore, it is possible to store a noninterlaced signal outputted from the camera device which incorporates an all-pixel reading image sensor or an image sensor for outputting a noninterlaced signal, into an external memory device for a computer, and to display an interlaced signal selectively outputted from the camera device on the screen of a monitor device such as of the NTSC type.

Although modifications and changes may be suggested by those skilled in the art, it is the intention of the inventors to embody within the patent warranted hereon all changes and modifications as reasonably and properly come within the scope of their contribution to the art.

What is claimed is:

1. A solid state imaging device comprising:
   a light receiving unit having a plurality of pixels arranged in a matrix fashion;
   color filters arranged on said pixels in a predetermined pattern corresponding to said pixels;
   a vertical transfer unit for transferring a charge generated in said light receiving unit;
   a horizontal transfer unit for receiving a charge from said vertical transfer unit to transfer the charge in the horizontal direction;
   an output unit for receiving a charge from said horizontal transfer unit to convert the charge into an electrical signal;
   a vertical drive circuit for supplying, in a case of noninterlaced signal processing, a first group of vertical transfer pulses to said vertical transfer unit in one horizontal blanking period to transfer a charge stored in each of said pixels to a one-line horizontal transfer unit and for supplying, and, in a case of an interlaced signal processing, a second group of vertical transfer pulses to said vertical transfer unit in one horizontal blanking period to transfer a charge stored in each of said charges to a two-line horizontal transfer unit; and
   a horizontal drive circuit for supplying a group of horizontal transfer pulses to said horizontal transfer unit,
   wherein,
   said group of second transfer pulses comprises said group of first transfer pulses which is supplied in two cycles, and horizontal transfer pulses are supplied to said horizontal shift register for transferring the signal charges transferred to the horizontal shift register by said predetermined number of pixels after said group of first transfer pulses is supplied in the first cycle.

2. A solid-state imaging device according to claim 1, wherein when said group of second transfer pulses is supplied in said horizontal blanking period, one said group of first transfer pulses is supplied in an arbitrary horizontal blanking period in every other vertical blanking period.

3. A solid-state imaging device according to claim 1, wherein said predetermined pattern is such that when color filters of an nth line (n=1, 2, . . . ) are spatially shifted a predetermined number of pixels, the repetitive pattern of colors of the nth line is the same as the repetitive pattern of colors of an (n+1)th line.

4. A solid-state imaging device according to claim 3, wherein said color filters are arranged in a G-stripe R/B grid coding pattern in which the color filters are shifted two pixels.

5. A solid-state imaging device according to claim 3, wherein said color filters are arranged in an R/B grid coding pattern in which the color filters are shifted one pixel.

6. A method of driving a solid-state imaging device having an imaging unit comprising a matrix of photodetectors as pixels for photoelectrically converting incident light from a subject into signal charges depending on the amount of the incident light, and color filters arranged on the imaging unit in a predetermined pattern corresponding to the pixels, comprising the steps of:
   transferring signal charges stored in the respective pixels in each line to a horizontal shift register based on a group of first transfer pulses supplied in a horizontal blanking period; and
   transferring signal charges stored in the respective pixels in each two lines to the horizontal shift register based on a group of second transfer pulses supplied in said horizontal blanking period,
   wherein,
   said group of second transfer pulses comprises said group of first transfer pulses which is supplied in two cycles, and horizontal transfer pulses are supplied to said horizontal shift register for transferring the signal charges transferred to the horizontal shift register by said predetermined number of pixels after said group of first transfer pulses is supplied in the first cycle.

7. A method according to claim 6, wherein when said group of second transfer pulses is supplied in said horizontal blanking period, one said group of first transfer pulses is supplied in an arbitrary horizontal blanking period in every other vertical blanking period.

8. A method according to claim 6, wherein said predetermined pattern is such that when color filters of an nth line (n=1, 2, . . . ) are spatially shifted a predetermined number of pixels, the repetitive pattern of colors of the nth line is the same as the repetitive pattern of colors of an (n+1)th line.

9. A method according to claim 8, wherein said color filters are arranged in a G-stripe R/B grid coding pattern in which the color filters are shifted two pixels.

10. A method according to claim 8, wherein said color filters are arranged in an R/B grid coding pattern in which the color filters are shifted one pixel.

11. A method according to claim 8, wherein said group of second transfer pulses comprises said group of first transfer pulses which is supplied in two cycles, and horizontal transfer pulses are supplied to said horizontal shift register for transferring the signal charges transferred to the horizontal shift register by said predetermined number of pixels after said group of first transfer pulses is supplied in the first cycle.

12. A camera device comprising:
a solid-state imaging device having an imaging unit comprising a matrix of photodetectors as pixels for photoelectrically converting incident light from a subject into signal charges depending on the amount of the incident light, and color filters arranged no the imaging unit in a predetermined pattern corresponding to the pixels;
a first timing generating circuit for generating a group of first transfer pulses for transferring signals charges stored in the respective pixels in a horizontal blanking period in each line to a horizontal shift register, based on a reference clock signal;
a second timing generating circuit for generating a group of second transfer pulses for transferring signals charges stored in the respective pixels in said horizontal blanking period in each two lines to the horizontal shift register, based on the reference clock signal; and
selecting means for selecting said group of first transfer pulses as a group of transfer pulses to be supplied to said solid-state imaging device based on an external command for a noninteriaced signal, and selecting said group of second transfer pulses as a group of transfer pulses to be supplied to said solid-state imaging device based on an external command for an interlaced signal,
wherein,
said group of second transfer pulses comprises said group of first transfer pulses which is supplied in two cycles, and horizontal transfer pulses are supplied to said horizontal shift register for transferring the signal charges transferred to the horizontal shift register by said predetermined number of pixels after said group of first transfer pulses is supplied in the first cycle.

13. A camera device according to claim 12, wherein when said group of second transfer pulses is selected by said selecting means, said second timing generating circuit outputs one of said group of first transfer pulses in an arbitrary horizontal blanking period in every other vertical blanking period.

14. A camera device according to claim 12, wherein said predetermined pattern is such that when color filters of an nth line (n=1, 2, . . . ) are spatially shifted by a redetermined number of pixels, the repetitive pattern of colors of the nth line is the same as the repetitive pattern of colors of an (n+1)th line.

15. A camera device according to claim 14, wherein said color filters are arranged in a G-stripe R/B grid coding pattern in which the color filters are shifted two pixels.

16. A camera device according to claim 14, wherein said color filters are arranged in an R/B grid coding pattern in which the color filters are shifted one pixel.

17. A camera system comprising:
a camera device having a solid-state imaging device having an imaging unit comprising a matrix of photodetectors as pixels for photoelectrically converting incident light from a subject into signal charges depending on the amount of the incident light and color filters arranged on the imaging unit in a predetermined pattern corresponding to the pixels, a first timing generating circuit for generating a group of first transfer pulses for transferring signals charges stored in the respective pixels in a horizontal blanking period in each line to a horizontal shift register, based on a reference clock signal, a second timing generating circuit for generating a group of second transfer pulses for transferring signals charges store din the respective pixels in said horizontal blanking period in each two lines to the horizontal shift register, based on the reference clock signal, and a selecting means for selecting said group of second transfer pulses as a group of transfer pulses to be supplied to said solid-state imaging device in normal operation, and selecting said group of first transfer pulses as a group of transfer pulses to be supplied to said solid-state imaging device based on an interrupt signal from an external shutter control key;
an external memory device having a memory for storing an imaging signal of at least one frame which is outputted from said solid-state imaging device;
a display device for converting the imaging signal outputted from said solid-state imaging device into a video signal and displaying the video signal on a screen; and
switching means for supplying the imaging signal outputted from said solid-state imaging device to said display device in the normal operation, and switching to supply the imaging signal outputted from said solid-state imaging device to said external memory device based on the interrupt signal from the external shutter control,
wherein,
said group of second transfer pulses comprises said group of first transfer pulses which is supplied in two cycles, and horizontal transfer pulses are supplied to said horizontal shift register for transferring the signal charges transferred to the horizontal shift register by said predetermined number of pixels after said group of first transfer pulses is supplied in the first cycle.

18. A camera system according to claim 17, wherein when said group of second transfer pulses is selected by said selecting means, said second timing generating circuit outputs one of said group of first transfer pulses in an arbitrary horizontal blanking period in every other vertical blanking period.

19. A camera system according to claim 17, wherein said predetermined pattern is such that when color filters of an nth line (n=1, 2, . . . ) are spatially shifted a predetermined number of pixels, the repetitive pattern of colors of the nth line is the same as the repetitive pattern of colors of an (n+1)th line.

20. A camera system according to claim 19, wherein said color filters are arranged in a G-stripe R/B grid coding pattern in which the color filters are shifted two pixels.

21. A camera system according to claim 19, wherein said color filters are arranged in an R/B grid coding pattern in which the color filters are shifted one pixel.

22. A method of driving a solid state imaging device having a plurality of pixels arranged in a matrix fashion and color filters arranged on said pixels in a predetermined pattern corresponding to said pixels, said predetermined pattern being such that when color filters of an nth line (n=1, 2, ... ) are spatially shifted by a predetermined number of pixels, the repetitive pattern of colors of the nth line is the same as the repetitive pattern of colors of an (n+1)th line, comprising the steps of:

outputting a pixel signal of one line amount in one horizontal period based on a command for a noninterlaced signal process supplied from an outside to said solid state imaging device; and displacing a pixel signal of an nth line by said predetermined number of pixels to add said pixel signal with a pixel signal of an (n+1)th line and then outputting an added signal in one horizontal period based on a command for an interlaced signal process supplied from an outside to said solid state imaging device.

* * * * *